(12) United States Patent
Kim et al.

(10) Patent No.: US 10,964,360 B2
(45) Date of Patent: Mar. 30, 2021

(54) MEMORY DEVICE INCLUDING ON-DIE-TERMINATION CIRCUIT

(71) Applicant: SAMSUNG ELECTRONICS CO., LTD., Suwon-si (KR)

(72) Inventors: Eun-Ji Kim, Suwon-si (KR); Jung-June Park, Seoul (KR); Jeong-Don Ihm, Seongnam-si (KR); Byung-Hoon Jeong, Hwaseong-si (KR); Young-Don Choi, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/875,163

(22) Filed: May 15, 2020

(65) Prior Publication Data
US 2020/0279591 A1 Sep. 3, 2020

Related U.S. Application Data

(63) Continuation of application No. 16/058,709, filed on Aug. 8, 2018, now Pat. No. 10,672,436.

(30) Foreign Application Priority Data

Nov. 3, 2017 (KR) .......................... 10-2017-0146179

(51) Int. Cl.
*G11C 7/10* (2006.01)
(52) U.S. Cl.
CPC .......... *G11C 7/1048* (2013.01); *G11C 7/1057* (2013.01); *G11C 7/1084* (2013.01); *G11C 2207/105* (2013.01)

(58) Field of Classification Search
None
See application file for complete search history.

(56) References Cited

U.S. PATENT DOCUMENTS

| 7,414,426 B2 | 8/2008 | Cox et al. |
| 7,486,104 B2 | 2/2009 | Oh et al. |
| 7,516,281 B2 | 4/2009 | Laberge |
| 7,952,944 B2 | 5/2011 | Kim et al. |
| 8,315,122 B2 | 11/2012 | Jo et al. |

(Continued)

FOREIGN PATENT DOCUMENTS

KR 1020170112289 10/2017

*Primary Examiner* — Crystal L Hammond
(74) *Attorney, Agent, or Firm* — Volentine, Whitt & Francos, PLLC

(57) ABSTRACT

A memory device includes; a first memory chip including a first on-die Termination (ODT) circuit comprising a first ODT resistor, a second memory chip including a second ODT circuit comprising a second ODT resistor, at least one chip enable signal pin that receives at least one chip enable signal, wherein the at least one chip enable signal selectively enables at least one of the first memory chip and the second memory chip, and an ODT pin commonly connected to the first memory chip and the second memory chip that receives an ODT signal, wherein the ODT signal defines an enable period for at least one of the first ODT circuit and the second ODT circuit, and in response to the ODT signal and the at least one chip enable signal, one of the first ODT resistor and the second ODT resistor is enabled to terminate a signal received by at least one of the first memory chip and the second memory chip.

20 Claims, 18 Drawing Sheets

(56) References Cited

U.S. PATENT DOCUMENTS

| | | |
|---|---|---|
| 9,165,639 B2 | 10/2015 | Ware et al. |
| 9,232,651 B2 | 1/2016 | Ware et al. |
| 9,640,282 B1 | 5/2017 | Chen et al. |
| 9,780,782 B2 | 10/2017 | Bains et al. |
| 2005/0134304 A1 | 6/2005 | Lee |
| 2006/0106951 A1* | 5/2006 | Bains ................ G06F 13/4086 |
| | | 710/5 |
| 2007/0126463 A1 | 6/2007 | Cox et al. |
| 2007/0126468 A1 | 6/2007 | Kim |
| 2008/0030221 A1* | 2/2008 | Lee .................... H04L 25/0278 |
| | | 326/30 |
| 2009/0273960 A1 | 11/2009 | Kim et al. |
| 2012/0113733 A1* | 5/2012 | Kim ...................... G11C 5/063 |
| | | 365/193 |
| 2012/0326746 A1 | 12/2012 | McCall et al. |
| 2013/0138898 A1 | 5/2013 | Osanai et al. |
| 2016/0087630 A1* | 3/2016 | Park .................. H03K 19/0005 |
| | | 326/30 |
| 2017/0077928 A1 | 3/2017 | Bains et al. |
| 2017/0093400 A1 | 3/2017 | Bains et al. |
| 2017/0109091 A1 | 4/2017 | Gans |
| 2017/0110178 A1* | 4/2017 | Bains ........................ G11C 8/12 |
| 2017/0288634 A1 | 10/2017 | Kang et al. |
| 2018/0322914 A1 | 11/2018 | Wu et al. |

\* cited by examiner

MEMORY DEVICE INCLUDING ON-DIE-TERMINATION CIRCUIT

CROSS-REFERENCE TO RELATED APPLICATION

This is a Continuation of U.S. application Ser. No. 16/058,709, filed Aug. 8, 2018, which claims the benefit of Korean Patent Application No. 10-2017-0146179, filed on Nov. 3, 2017 in the Korean Intellectual Property Office, the disclosure of which is hereby incorporated by reference in its entirety.

BACKGROUND

The inventive concept relates to a memory device, and more particularly, to a memory device including an on-die-termination (ODT) circuit, a storage device including the memory device, and an operating method of the storage device.

A storage device may include a nonvolatile memory and a controller configured to control the nonvolatile memory. In conventional memory systems, signal communication between nonvolatile memory and a controller has often performed at relatively low operating frequencies, as compared with signal communication in memory systems including high speed memory, such as dynamic random-access memory (DRAM) or static random-access memory (SRAM). And historically, the integrity (or robustness) of signals communicated between nonvolatile memory and a controller has not been a critical factor in the overall performance of a storage device incorporating such memory systems. More recently, however, demand for high speed storage devices is rising, and signal integrity has become a very important factor in the design and operation of storage device(s) in computing systems and/or mobile communication systems.

SUMMARY

According to an aspect of the inventive concept, there is provided a memory device including; a first memory chip including a first on-die Termination (ODT) circuit comprising a first ODT resistor, a second memory chip including a second ODT circuit comprising a second ODT resistor, at least one chip enable signal pin that receives at least one chip enable signal, wherein the at least one chip enable signal selectively enables at least one of the first memory chip and the second memory chip, and an ODT pin commonly connected to the first memory chip and the second memory chip that receives an ODT signal, wherein the ODT signal defines an enable period for at least one of the first ODT circuit and the second ODT circuit, and in response to the ODT signal and the at least one chip enable signal, one of the first ODT resistor and the second ODT resistor is enabled to terminate a signal received by at least one of the first memory chip and the second memory chip.

According to an aspect of the inventive concept, there is provided a memory device including; a first chip enable signal pin that receives a first chip enable signal, a second chip enable signal pin that receives a second chip enable signal, a first memory chip including a first on-die-termination (ODT) circuit and a second memory chip including a second ODT circuit, wherein the first memory chip and second memory chip are commonly connected to the first chip enable signal pin, a third memory chip including a third ODT circuit and a fourth memory chip including a fourth ODT circuit, wherein the third memory chip and fourth memory chip are commonly connected to the second chip enable signal pin, and an ODT pin that receives an ODT signal, wherein the first memory chip, the second memory chip, the third memory chip and the fourth memory chip are commonly connected to the ODT pin, wherein in response to the ODT signal, the first ODT circuit uses a first ODT resistor to terminate a signal received by at least one of the first memory chip, the second memory chip, the third memory chip and the fourth memory chip, the second ODT circuit uses a second ODT resistor to terminate the signal, the third ODT circuit uses a third ODT resistor to terminate the signal, or the fourth ODT circuit uses a fourth ODT resistor to terminate the signal.

According to an aspect of the inventive concept, there is provided a memory device including; a first memory chip and a second memory chip, at least one chip enable signal pin that receives at least one chip enable signal selectively enabling at least one of the first memory chip and the second memory chip, a first on-die-termination (ODT) pin that receives a first ODT signal activated in a write operation for one of the first memory chip and the second memory chip, and a second ODT pin configured to receive a second ODT signal activated in a read operation for one of the first memory chip and the second memory chip. Each of the first memory chip and the second memory chip includes; a first ODT circuit enabled in response to the first ODT signal, such that either a first ODT resistor or a second ODT resistor is used to terminate a signal received by at least one of the first memory chip and the second memory chip, and a second ODT circuit enabled in response to the second ODT signal, such that either a first ODT resistor or a second ODT resistor is used to terminate a signal received by at least one of the first memory chip and the second memory chip.

According to an aspect of the inventive concept, there is provided a method of controlling a memory device including a first memory chip including a first On-Die Termination (ODT) circuit and a second memory chip including a second ODT circuit. The method includes; in response to at least one of a read enable signal, a chip enable signal, and a ODT signal selecting the first memory chip and non-selecting the second memory chip, upon non-selecting of the second memory chip, terminating a signal received by the second memory chip using a second ODT resistor in the second memory chip, receiving write data, and performing a write operation in the first memory chip while terminating the signal received by the second memory chip using the second ODT resistor.

According to an aspect of the inventive concept, there is provided a method of controlling a memory device including a first memory chip including a first On-Die Termination (ODT) circuit and a second memory chip including a second ODT circuit. The method includes; in response to at least one of a read enable signal, a chip enable signal, and a ODT signal selecting the first memory chip and non-selecting the second memory chip, upon non-selecting of the second memory chip, terminating a signal received by the second memory chip using a second ODT resistor in the second memory chip, and performing a read operation in the first memory chip while terminating the signal received by the second memory chip using the second ODT resistor.

BRIEF DESCRIPTION OF THE DRAWINGS

Embodiments of the inventive concept will be more clearly understood from the following detailed description taken in conjunction with the accompanying drawings in which.

DETAILED DESCRIPTION

Figure 1:
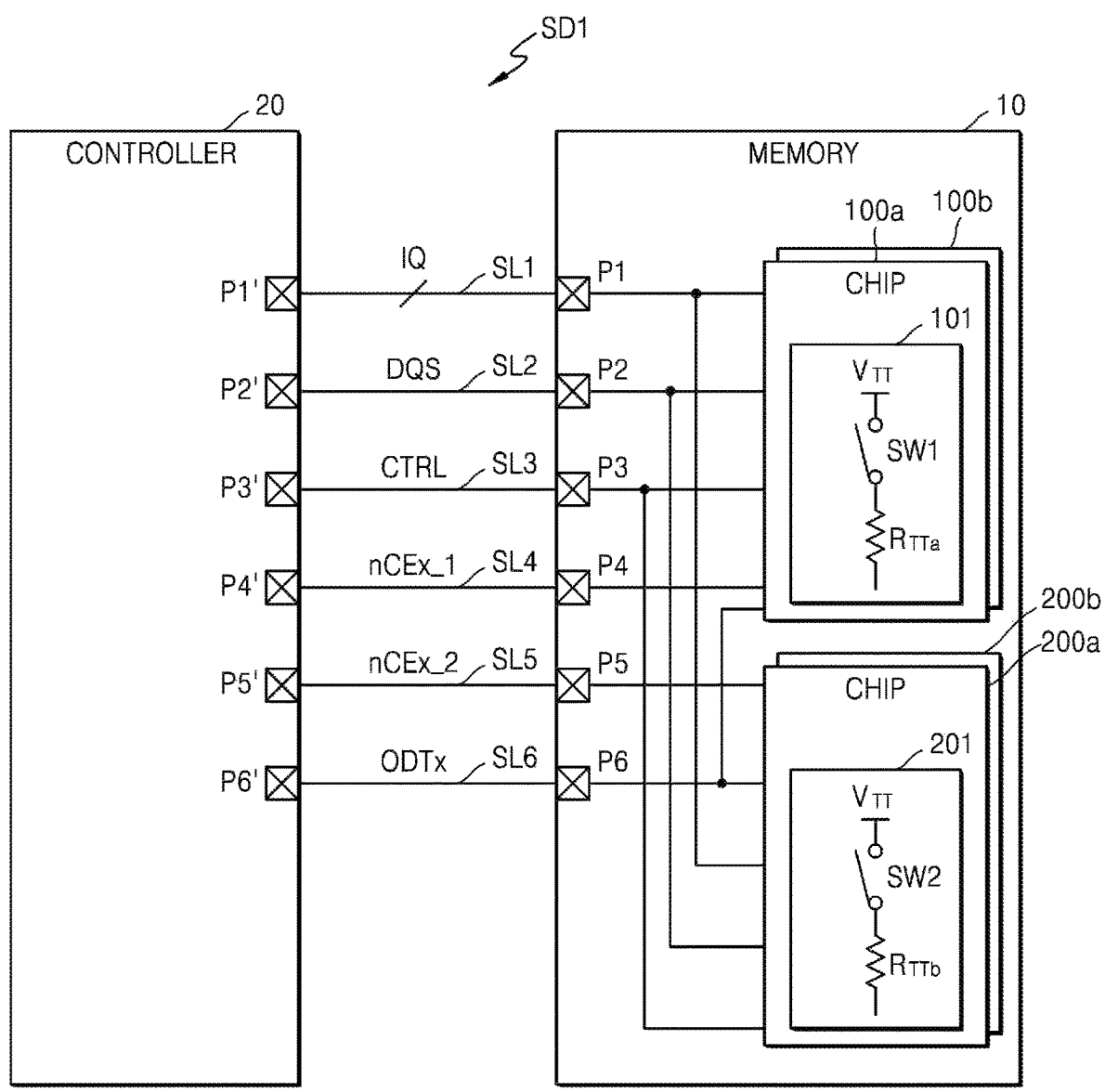
FIG. 1 is a block diagram schematically illustrating a storage device according to an embodiment of the inventive concept.

FIG. 1 is a block diagram illustrating a storage device SD1 according to an embodiment of the inventive concept.

Referring to FIG. 1, the storage device SD1 may include a memory 10 and a controller 20, where the memory 10 may include a plurality of memory chips (e.g.) 100a, 100b, 200a, and 200b. In certain embodiments, the memory 10 may be referred to as "a multi-chip memory". For example, each of the plurality of memory chips 100a, 100b, 200a, and 200b may be a dual die package (DDP) or a quadruple die package (QDP).

In FIG. 1, the memory chip 100a includes an on-die-termination (ODT) circuit 101, and the memory chip 200a includes an ODT circuit 201. In certain embodiments, at least one of the memory chips 100a, 100b, 200a, and 200b may be a nonvolatile memory chip. For example, one or more of the memory chips 100a, 100b, 200a, and 200b may be a NAND flash memory chip, a resistive memory chip such as a resistive random-access memory (ReRAM), a phase change RAM (PRAM), and/or a magnetic RAM (MRAM). Furthermore, at least one of the memory chips 100a, 100b, 200a, and 200b may be a volatile memory chip such as a DRAM.

In FIG. 1, the memory 10 and controller 20 may communicate via first, second, third, fourth, fifth and sixth signal lines (inclusively, first "through" sixth signal lines, SL1 through SL6). Here, each "signal line" (e.g., SL1, SL2, SL3, SL4, SL5 and SL6) may include one or more signal line(s) capable of competently transmitting and/or receiving (hereafter, singularly or collectively, "communicating") information in the form of at least one or more electrical signal(s). Assuming the exemplary configuration illustrated in FIG. 1, command, address and/or data information may be communicated via the first signal line SL1. Accordingly, the first signal line SL1 may be referred to as input and output (I/O) line or an I/O bus. A data strobe signal DQS may be communicated via the second signal line SL2, and the second signal line SL2 may be referred to as a data strobe signal line. A control signal CTRL may be communicated via the third signal line SL3, and the third signal line SL3 may be referred to as a control signal line.

A first chip enable signal (e.g., a signal for selectively enabling memory chips 100a and 100b) nCEx_1 may be communicated via the fourth signal line SL4, and the fourth signal line SL4 may be referred to as a first chip enable signal line. A second chip enable signal (e.g., a signal for selectively enabling the memory chips 200a and 200b) nCEx_2 may be communicated via the fifth signal line SL5, and the fifth signal line SL5 may be referred to as a second chip enable signal line. An ODT signal ODTx may be communicated via the sixth signal line SL6, and the sixth signal line SL6 may be referred to as an ODT signal line.

During a write operation, the controller 20 may output a write command and an address. In response to the write command, the controller 20 may output data signals and the data strobe signal DQS. During a read operation, the controller 20 may output a read command and an address. In response to the read command, the controller 20 may receive data signals. In this regard, the data strobe signal DQS may necessarily be toggled at a relatively high frequency (a "first toggle frequency") depending on the nature (e.g., read versus write) of an incoming stream of operations. And recognizing that fewer than all of the memory chips 100a, 100b, 200a, and 200b will be selected during a particular write operation, the data strobe signal DQS is likely to be reflected from non-selected ones of the memory chip 100a, 100b, 200a, and 200b.

As noted above, the controller 20 may generate the ODT signal ODTx which is used to control the functionality of operation of the ODT circuits 101 and 201. That is, the ODT signal ODTx may be used to define respective enable periods for the ODT circuits 101 and 201.

The controller 20 may also generate the control signal CTRL which is used to control operation of the memory chips 100a, 100b, 200a, and 200b. That is, the control signal CTRL may include a read enable signal for enabling read operations by the memory chips 100a, 100b, 200a, and 200b, where the read enable signal may be toggled at another relatively high frequency (a "second toggle frequency", where the first toggle frequency and the second toggle frequency may be the same or different). Again, recognizing that fewer than all of the memory chips 100a, 100b, 200a, and 200b will be selected during a particular read operation, the read enable signal is likely to be reflected from non-selected ones of the memory chip 100a, 100b, 200a, and 200b.

During period(s) in which the data strobe signal DQS is toggled at the first toggle frequency as the result of one or more write operation(s), the controller 20 may activate the ODT signal ODTx to avoid the data strobe signal DQS being reflected from non-selected ones of the memory chip 100*a*, 100*b*, 200*a*, or 200*b* (e.g., memory chip(s) in a stand-by state). And during period(s) in which the read enable signal is toggled at the second toggle frequency as the result of one or more read operation(s), the controller 20 may activate the ODT signal ODTx to avoid the read enable signal being reflected from non-selected ones of the memory chip 100*a*, 100*b*, 200*a*, or 200*b*.

In the illustrated embodiment of FIG. 1, the memory 10 includes first through sixth pins P1 through P6, where the memory chips 100*a*, 100*b*, 200*a*, and 200*b* are commonly connected to each of the first through third and sixth pins, P1, P2, P3 and P6. In addition, the memory chips 100*a* and 100*b* are connected to the fourth pin P4, and the memory chips 200*a* and 200*b* may be connected to the fifth pin P5. Here, each one of the first through sixth pins P1 through P6 may be referred to as first through sixth pads. In this regard it should be noted that the first through sixth pins (pads) P1 through P6 may be variously configured as conventionally understood, and may include one or more respective pins (pads).

It follows from the foregoing description of the illustrated embodiment that the first pin P1 is connected to the first signal line SL1 and may be referred to as an I/O pin. The second pin P2 is connected to the second signal line SL2, and may be referred to as a data strobe signal pin. The third pin P3 is connected to the third signal line SL3, and may be referred to as a control signal pin. The fourth pin P4 is connected to the fourth signal line SL4, and may be referred to as a first chip enable signal pin. The fifth pin P5 is connected to the fifth signal line SL5, and may be referred to as a second chip enable signal pin. The sixth pin P6 is connected to the sixth signal line SL6, and may be referred to as an ODT pin. The controller 20 of FIG. 1 includes first through sixth pins (pads) P1' through P6' respectively connected to the first through sixth signal lines SL1 through SL6.

With this configuration, the second signal line SL2 may be commonly connected to the memory chips 100*a*, 100*b*, 200*a*, and 200*b* via the second pin P2, and the data strobe signal DQS communicated via the second signal line SL2 to the memory chips 100*a*, 100*b*, 200*a*, and 200*b*. For example, assuming that the memory chips 100*a*, 200*a*, and 200*b* are non-selected and the memory chip 100*b* is selected, the data strobe signal DQS may be reflected from the non-selected memory chips 100*a*, 200*a*, and 200*b* which are in a stand-by state.

However, in accordance with certain embodiments of the inventive concept, the non-selected memory chip 100*a* may enable the ODT circuit 101 based on the ODT signal ODTx, and the non-selected memory chip 200*a* may enable the ODT circuit 201 based on the ODT signal ODTx. The non-selected memory chip 100*a* may determine a resistance for a first ODT resistor $R_{TTa}$ of the ODT circuit 101 based on the ODT signal ODTx and the first chip enable signal nCEx_1. Similarly, the non-selected memory chips 200*a* and 200*b* may determine the resistance of a second ODT resistor $R_{TTb}$ of the ODT circuit 201 based on the ODT signal ODTx and the second chip enable signal nCEx_2. Accordingly, any signal reflection of the data strobe signal DQS may be prevented at the non-selected memory chips 100*a*, 200*a*, and 200*b*, and the reduction or elimination of signal reflection improves signal integrity.

Further in relation to the foregoing, the non-selected memory chips 100*a*, 200*a*, and 200*b* may determine whether the current operation being performed with respect to the selected memory chip 100*b* is either a write operation or a read operation based on the control signal CTRL, and may further determine an appropriate ODT mode based on the control signal determination. For example, the control signal CTRL may be a read enable signal. Hereinafter, embodiment descriptions will be provided that assume that the control signal CTRL being determined is the read enable signal. However, the inventive concept is not limited thereto, and the control signal CTRL may be one or more of various control signals indicating various operations of the memory 10.

In FIG. 1, the first ODT circuit 101 includes a first ODT switch SW1 and a first ODT resistor $R_{TTa}$ connected in series. The first ODT switch SW1 may be connected between a power voltage terminal $V_{TT}$ and the first ODT resistor $R_{TTa}$, and may be driven by the ODT signal ODTx, the control signal CTRL, and the first chip enable signal nCEx_1. Thus, one end of the first ODT resistor $R_{TTa}$ may be connected to the first ODT switch SW1 and the other end may be connected to one of the first, second or third signal lines SL1, SL2 and SL3. When the first ODT switch SW1 is turned ON in response to the ODT signal ODTx, the control signal CTRL, and the first chip enable signal nCEx_1, the power voltage terminal $V_{TT}$ may be connected to one of the first, second or third signal lines SL1, SL2 and SL3. However, the ODT circuit 101 may be variously configured and is not limited to the foregoing example.

The second ODT circuit 201 may be substantially similar in configuration including a second ODT resistor $R_{TTb}$ and a second ODT switch SW2 connected in series.

For storage devices wherein memory 10 lacks the sixth pin P6, the controller 20 must communicate an ODT enable command sequentially to each of the non-selected memory chips 100*a*, 200*a*, and 200*b*, before communicating a write command or a read command to the selected memory chip 100*b*. This approach may increase the command overhead time required to communicate the ODT enable signal. It should be noted here that as the total number of memory chips in the memory 10 increases, the number of unselected memory chips during a given operation will also increase. And since the ODT enable command has to be communicated to each of the non-selected memory chips, the command overhead time may further increase.

However, embodiments of the inventive concept wherein the memory 10 includes the sixth pin P6, the memory chips 100*a*, 100*b*, 200*a*, and 200*b* may be commonly connected to the sixth pin P6 to thereby receive the ODT signal ODTx. Thus, while the controller 20 transmits a write command or a read command with respect to the selected memory chip 100*b* via the first signal line SL1, the controller 20 may simultaneously communicate the ODT signal ODTx, which defines an enable period of the ODT circuit 101 in the non-selected memory chip 100*a* and an enable period of the ODT circuit 201 in each of the non-selected memory chips 200*a* and 200*b* via the sixth signal line SL6. In this context, the term "simultaneously communicate" means the communication of both the write/read command and the ODT signal in a manner that temporally overlaps, wholly or in part. Therefore, the command overhead time may be decrease in embodiments of the inventive concept, and performance of the storage device SD1 improved.

Of further note in relation to FIG. 1, the memory 10 include the fourth pin P4, where the memory chips 100*a* and 100*b* are connected to the fourth pin P4 in order to receive the first chip enable signal nCEx_1. Thus, the memory chips 100a and 100b may adaptively determine the resistance of the first ODT resistor $R_{TTa}$ based on the first chip enable signal nCEx_1, thereby more effectively suppressing or eliminating the reflection of certain high frequency (toggling) signals (e.g., data strobe signal DQS and read enable signal). Likewise, the memory 10 includes the fifth pin P5, where the memory chips 200a and 200b are connected to the fifth pin P5 in order to receive the second chip enable signal nCEx_2. Thus, the memory chips 200a and 200b may adaptively determine the resistance of the second ODT resistor $R_{TTb}$ based on the second chip enable signal nCEx_2, thereby more effectively suppressing or eliminating signal reflections (e.g., data strobe signal DQS and read enable signal).

In certain embodiments, the storage device SD1 of FIG. 1 may operate as an internal memory variously mounted within an electronic apparatus. For example, the storage device SD1 may be a solid state drive (SSD), an embedded universal flash storage (UFS) memory device, or an embedded multimedia card (eMMC). In some embodiments, the storage device SD1 may operate as an external memory detachable from an electronic apparatus. For example, the storage device SD1 may include a UFS memory card, a compact flash (CF) card, a secure digital (SD) card, a micro secure digital (Micro-SD) card, a mini secure digital (Mini-SD) card, an extreme digital (xD) card, or a memory stick.

Figure 2:
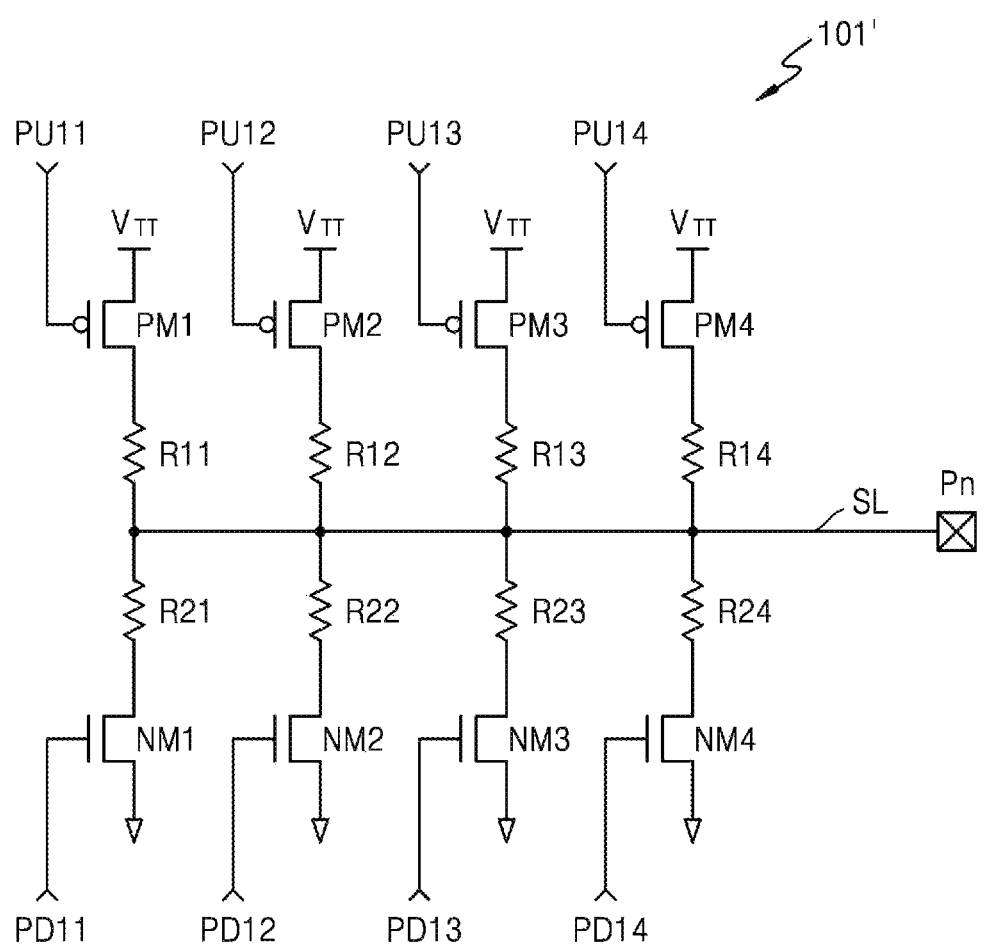
FIG. 2 is a circuit diagram of an example of an on-die-termination (ODT) circuit of FIG. 1.

FIG. 2 is a circuit diagram further illustrating in one embodiment (101') the ODT circuit 101 of FIG. 1.

Referring to FIG. 2, the ODT circuit 101' includes p-type metal oxide semiconductor (PMOS) transistors PM1, PM2, PM3 and PM4 (inclusively, "PM1 though PM4"), n-type metal oxide semiconductor (NMOS) transistors NM1, NM2, NM3 and NM4 (inclusively, "NM1 through NM4"), and resistors R11, R12, R13, R14 (inclusively, "R11 through R14") and R21, R22, R23 and R24 (inclusively, "R21 through R24"). Other embodiments of a competent ODT circuit are possible, and the number and arrangement of PMOS transistors, NMOS transistors, and resistors in FIG. 2 are exemplary. The PMOS transistors PM1 though PM4 may be respectively turned ON/OFF in response to control signals PU11, PU12, PU13 and PU14 (inclusively, "PU11 through PU14"), and the NMOS transistors NM1 through NM4 may also be respectively turned ON/OFF in response to control signals PD11 through PD14, where the control signals PU11 through PU14 correspond to a first ODT control signal ODT_EN1 or a second ODT control signal ODT_EN2. (See hereafter, the description presented in relation to FIG. 7).

Accordingly, some of the resistors R11 through R14 and R21 through R24 (inclusively, "R11 through R24") may be respectively connected to a pin (e.g., pin Pn in FIG. 2) via a signal line SL, such that the termination resistance of the ODT circuit 101' may be adaptively determined. Here, the pin Pn may be any one of the first, second or third pins P1 through P3 of FIG. 1, where the termination resistance of the ODT circuit 101' may be adaptively determined to be the same as an impedance of the signal line SL corresponding to the ODT circuit 101'. Accordingly, the ODT circuit 101' may match impedances to effectively absorb the energy of a signal communicated via the signal line SL corresponding to the ODT circuit 101', and prevent signal reflections to a receiving terminal.

Figure 3:
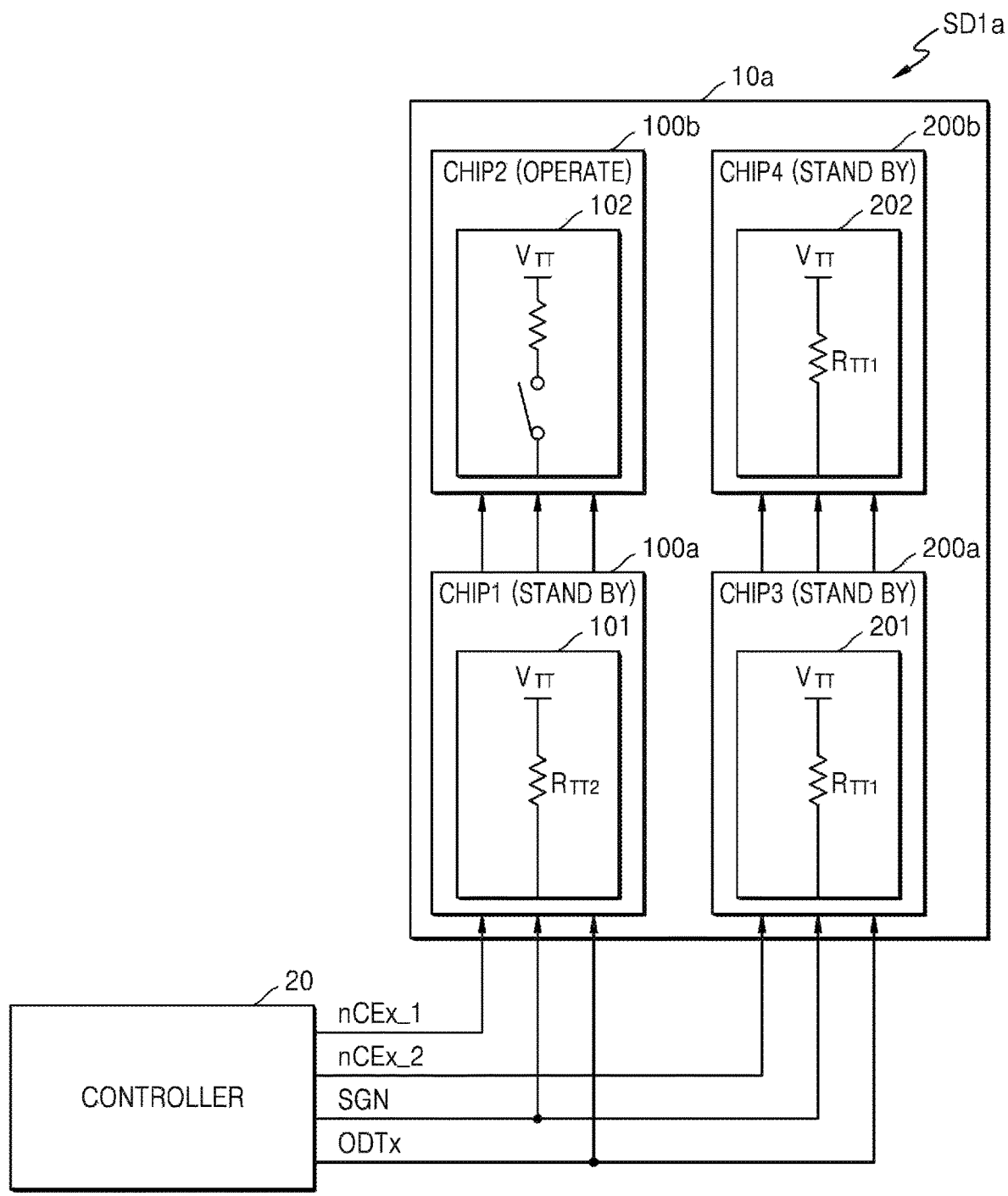
FIG. 3 is a block diagram of an example of the storage device of FIG. 1, according to an embodiment of the inventive concept.

FIG. 3 is a block diagram further illustrating in one embodiment (SD1a) the storage device SD1 of FIG. 1 according to an embodiment of the inventive concept.

Referring to FIG. 3, the storage device SD1a includes a memory 10a and controller 20, where the memory 10a includes first through fourth memory chips 100a, 100b, 200a, and 200b. The first chip enable signal nCEx_1 is assumed to be at an enable level (e.g., a logically "low" level), and the second chip enable signal nCEx_2 is assumed to be at a disable level (e.g., a logically "high" level). Further, the controller 20 is assumed to provide the memory 10a with an address selecting the second memory chip 100b.

Under these assumptions, the second memory chip 100b is selected, and the first, third, and fourth memory chips 100a, 200a, and 200b may be non-selected. Accordingly, a method of suppressing signal reflections from the non-selected first, third, and fourth memory chips 100a, 200a, and 200b is required. Thus, a first ODT circuit 101 in the non-selected first memory chip 100a, a third ODT circuit 201 in the non-selected third memory chip 200a, and a fourth ODT circuit 202 in the non-selected fourth memory chip 200b are enabled. In contrast, a second ODT circuit 102 in the selected second memory chip 100b is disabled.

The first and second memory chips 100a and 100b may receive the first chip enable signal nCEx_1, a signal SGN, and an ODT signal ODTx from the controller 20. For example, the signal SGN may be the data signal, the data strobe signal DQS, or the control signal CTRL of FIG. 1. When the ODT signal ODTx is enabled, the first memory chip 100a may determine ODT resistance based on the first chip enable signal nCEx_1. For example, when the first chip enable signal nCEx_1 is enabled, the first memory chip 100a may determine ODT resistance to be the resistance of a second ODT resistor $R_{TT2}$.

The third and fourth memory chips 200a and 200b may receive the second chip enable signal nCEx_2, the signal SGN, and the ODT signal ODTx from the controller 20. Here again, the signal SGN may be the data signal, the data strobe signal DQS, or the control signal CTRL of FIG. 1. When the ODT signal ODTx is enabled, each of the third and fourth memory chips 200a and 200b may determine ODT resistance based on the second chip enable signal nCEx_2. When the second chip enable signal nCEx_2 is disabled, each of the third and fourth memory chips 200a and 200b may determine ODT resistance to be the resistance of a first ODT resistor $R_{TT1}$. Of further note, the first ODT resistor $R_{TT1}$ and second ODT resistor $R_{TT2}$ may have different or the same resistance values. In certain embodiments of the inventive concept, one or both of the first ODT resistor $R_{TT1}$ and the second ODT resistor $R_{TT2}$ may have an infinite resistance value.

Figure 4:
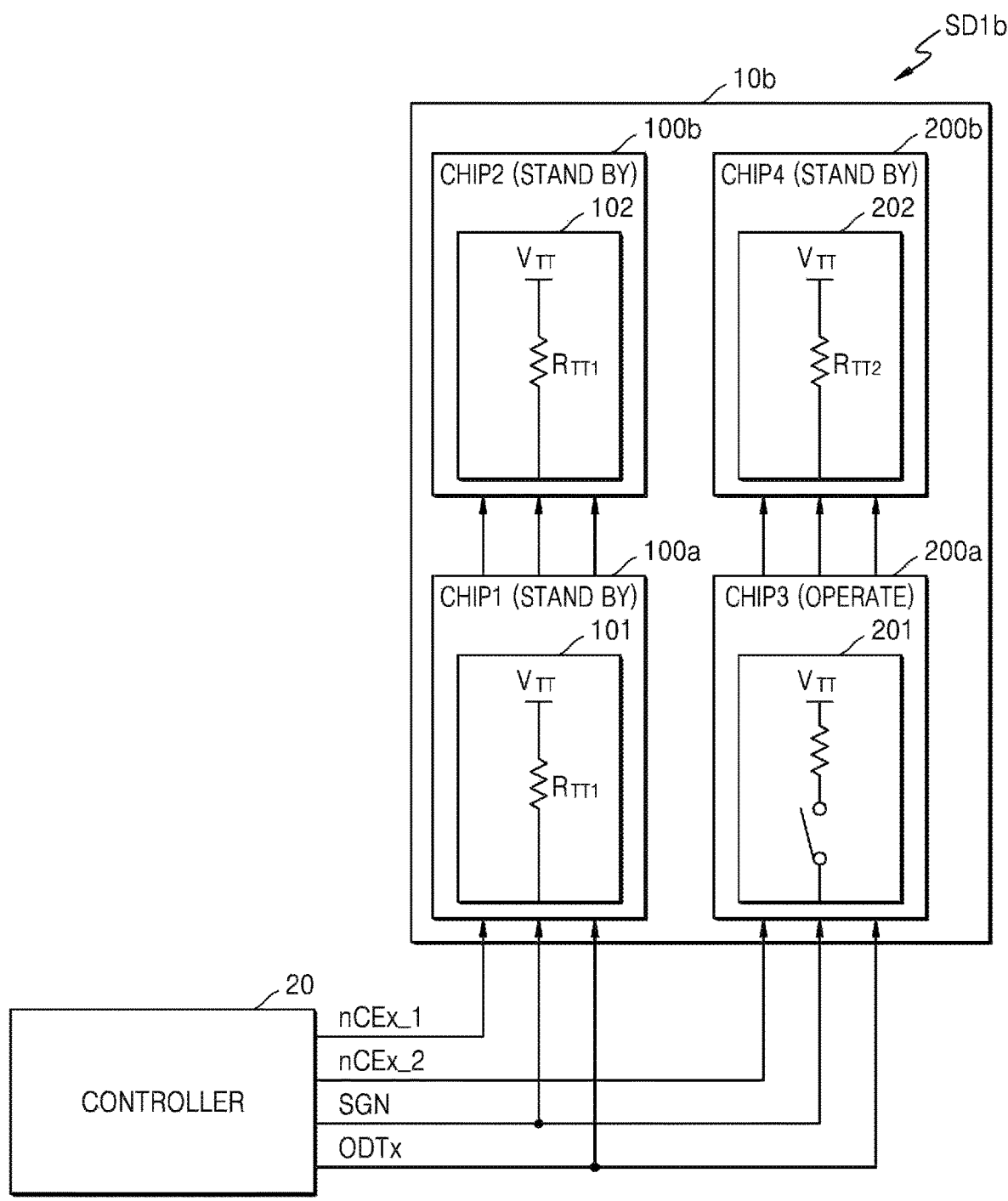
FIG. 4 is a block diagram of another example of the storage device of FIG. 1, according to an embodiment of the inventive concept.

FIG. 4 is a block diagram further illustrating in another embodiment (SD1b) the storage device SD1 of FIG. 1 according to an embodiment of the inventive concept.

Referring to FIG. 4, the storage device SD1b includes a memory 10b and controller 20, where memory 10b include first through fourth memory chips 100a, 100b, 200a, and 200b. Here, however, the first chip enable signal nCEx_1 is disabled (e.g., high), the second chip enable signal nCEx_2 is enabled (e.g., low), and the controller 20 provides the memory 10b with an address selecting the third memory chip 200a.

Accordingly, the third memory chip 200a is selected, and the first, second, and fourth memory chips 100a, 100b, and 200b are non-selected. Consistent with the foregoing, therefore, suppression of signal reflections from the non-selected first, second, and fourth memory chips 100a, 100b, and 200b is required. Hence, the ODT circuit 101 in the non-selected first memory chip 100a, an ODT circuit 102 in the non-selected second memory chip 100b, and an ODT circuit 202 in the non-selected fourth memory chip 200b are enabled. Whereas, the ODT circuit 201 in the selected third memory chip 200a is disabled.

The first and second memory chips 100a and 100b receive the first chip enable signal nCEx_1, a signal SGN, and an ODT signal ODTx from the controller 20. The signal SGN may be the data signal, the data strobe signal DQS, or the control signal CTRL of FIG. 1. When the ODT signal ODTx is enabled, the first and second memory chips 100a and 100b may determine ODT resistance in response to the first chip enable signal nCEx_1. When the first chip enable signal nCEx_1 is disabled, the first and second memory chips 100a and 100b may determine ODT resistance to be the resistance of a first ODT resistor $R_{TT1}$.

The third and fourth memory chips 200a and 200b may receive the second chip enable signal nCEx_2, the signal SGN, and the ODT signal ODTx from the controller 20. The signal SGN may be the data signal, the data strobe signal DQS, or the control signal CTRL of FIG. 1. When the ODT signal ODTx is enabled, the fourth memory chip 200b may determine ODT resistance in response to the second chip enable signal nCEx_2. For example, when the second chip enable signal nCEx_2 is enabled, the fourth memory chip 200b may determine ODT resistance to be the resistance of a second ODT resistor $R_{TT2}$. In certain embodiments of the inventive concept, the first ODT resistor $R_{TT1}$ and the second ODT resistor $R_{TT2}$ may have resistance values that are the same or different, and one of the first ODT resistor $R_{TT1}$ or the second ODT resistor $R_{TT2}$ may have an infinite resistance value.

Figure 5A:
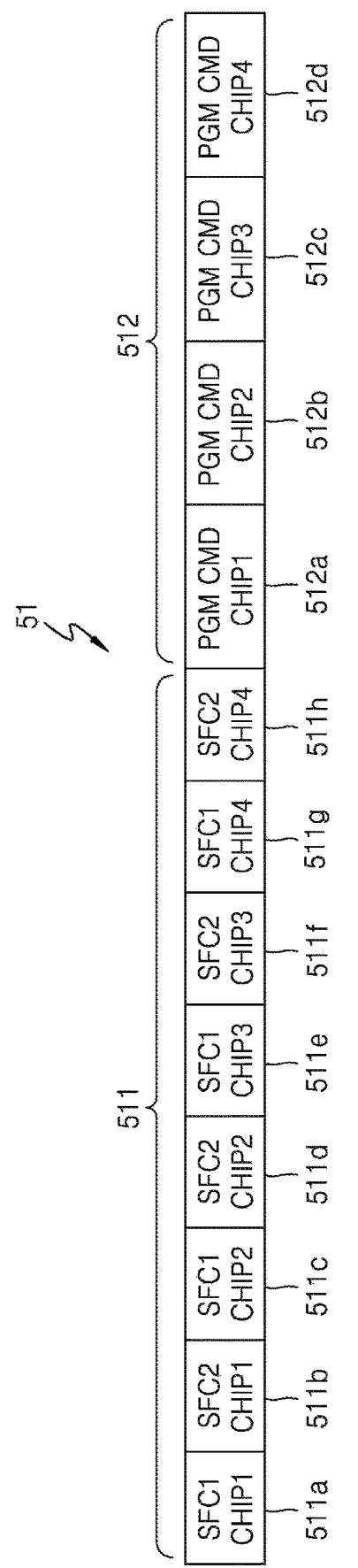
FIGS. 5A and 5B respectively illustrate commands according to some embodiments of the inventive concept.

FIG. 5A is a conceptual diagram illustrating in one example an exemplary sequence of commands 51 that may be received by a storage device according to an embodiment of the inventive concept.

Referring to FIGS. 1 and 5A, the controller 20 may sequentially communicate the commands 51 to the memory 10. The commands 51 include set feature commands 511 and program commands 512, where the set feature commands 511 include information associated with first and second ODT resistance values of the first through fourth memory chips 100a, 100b, 200a, and 200b. Accordingly, the controller 20 may initially communicate the set feature commands 511 to the memory 10 before transmitting the program commands 512, whereby the first through fourth memory chips 100a, 100b, 200a, and 200b may store the first and second ODT resistance values before executing program operations indicated by program commands 512.

In relation to the illustrated example of FIG. 5A, first set feature commands 511a, 511c, 511e and 511g for the first through fourth memory chips 100a, 100b, 200a and 200b may include first ODT resistance values respectively associated with the first through fourth memory chips 100a, 100b, 200a and 200b, and second set feature commands 511b, 511d, 511f and 511h for the first through fourth memory chips 100a, 100b, 200a and 200b may include second ODT resistance values respectively associated with the first through fourth memory chips 100a, 100b, 200a and 200b. Accordingly, each of the first through fourth memory chips 100a, 100b, 200a, and 200b may store a first ODT resistance value and a second ODT resistance value in advance of performing program operations.

Figure 5B:
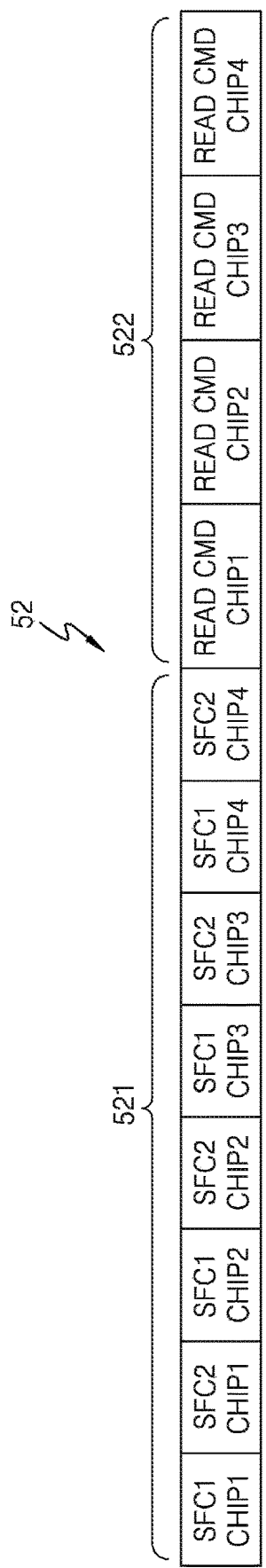

FIG. 5B is another conceptual diagram illustrating in another example an exemplary sequence of commands 52 that may be received by a storage device according to an embodiment of the inventive concept.

Referring to FIGS. 1 and 5B, the controller 20 may sequentially communicate the commands 52 to the memory 10. The commands 52 include set feature commands 521 and read commands 522, where the set feature commands 521 include information about first and second ODT resistance values of the first through fourth memory chips 100a, 100b, 200a, and 200b. As such, the controller 20 may initially communicate the set feature commands 521 to the memory 10 before transmitting the read commands 522. Thus, the first through fourth memory chips 100a, 100b, 200a, and 200b may store the first and second ODT resistance values in advance of performing read operations. The set feature commands 521 may be implemented substantially the same as the set feature commands 511 of FIG. 5A.

Figure 6:
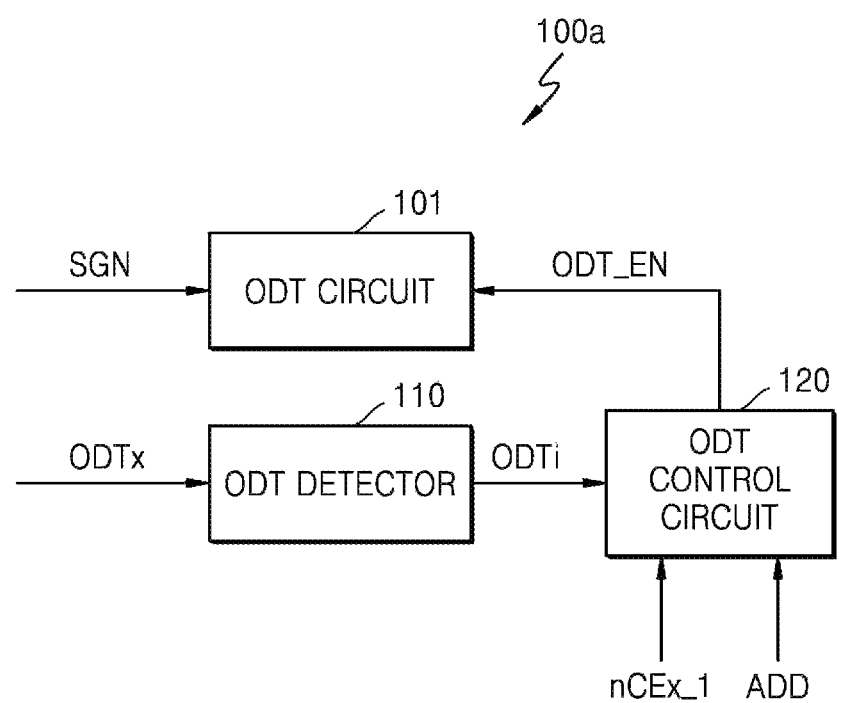
FIG. 6 is a block diagram of a first memory chip according to an embodiment of the inventive concept.

FIG. 6 is a block diagram further illustrating in one example the first memory chip 100a of FIGS. 1, 3 and 4 according to embodiments of the inventive concept.

Referring to FIG. 6, the first memory chip 100a includes an ODT detector 110, an ODT control circuit 120, and an ODT circuit 101. Here, the ODT detector 110 may receive an ODT signal ODTx, and output an internal ODT signal ODTi based on the received ODT signal ODTx. The ODT control circuit 120 may generate an ODT control signal ODT_EN based on the internal ODT signal ODTi, a first chip enable signal nCEx_1, and an address ADD. The ODT circuit 101 may receive a signal SGN and may provide a first ODT resistor (e.g., the ODT resistor $R_{TT1}$) or a second ODT resistor (e.g., the ODT resistor $R_{TT2}$) when the ODT control signal ODT_EN is activated. For example, the signal SGN may be a signal received from at least one of the first, second and third pins P1, P2 and P3 of FIG. 1.

When the internal ODT signal ODTi is "enabled" (i.e., has a signal level indicating an enabled state) and the first chip enable signal nCEx_1 is "disabled" (i.e., has a signal level indicating a disabled state), the ODT control circuit 120 may activate the OCT control signal ODT_EN, such that the ODT circuit 101 provides the first ODT resistor (e.g., the ODT resistor $R_{TT1}$). When both the internal ODT signal ODTi and the first chip enable signal nCEx_1 are enabled, the ODT control circuit 120 may generate the ODT control signal ODT_EN according to the address ADD. For example, when the address ADD indicates the second memory chip 100b, the ODT control circuit may activate the ODT control signal ODT_EN such that the ODT circuit 101 provides the second ODT resistor (e.g., the ODT resistor $R_{TT2}$). Alternately, when the address ADD indicates the first memory chip 100a, the ODT control circuit 120 may deactivate the ODT control signal ODT_EN such that the ODT circuit 101 is disabled.

Figure 7:
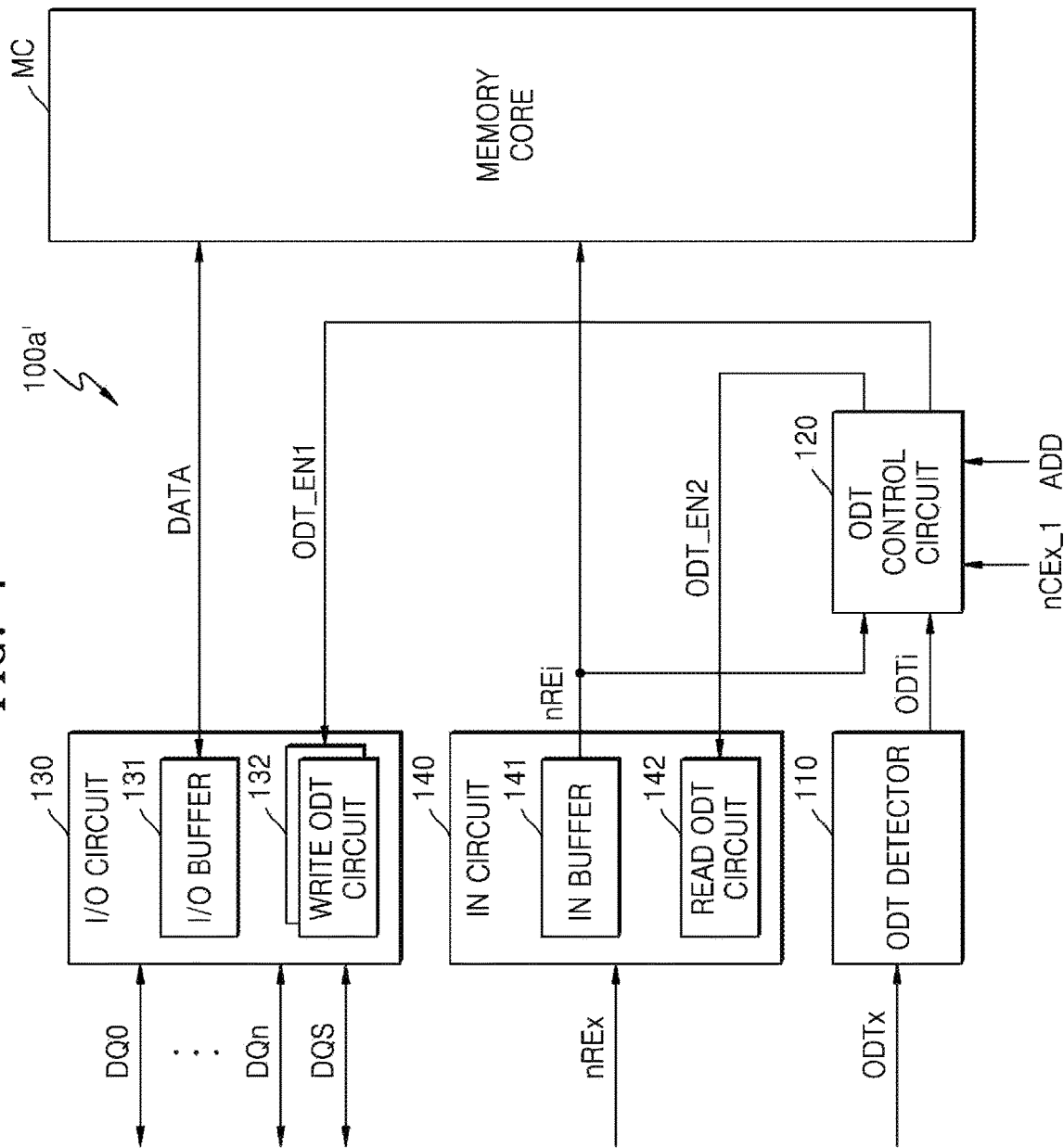
FIG. 7 is a block diagram illustrating a first memory chip according to an embodiment of the inventive concept in detail.

FIG. 7 is a block diagram further illustrating in another example a first memory chip 100a' according to an embodiment of the inventive concept.

Referring to FIGS. 1 and 7, the first memory chip 100a' includes an ODT detector 110, an ODT control circuit 120, an input/output (I/O) circuit 130, and an input circuit 140. In addition, the first memory chip 100a' may further include a memory core MC. The memory core MC may include a memory cell array, a row decoder, a page buffer, a voltage generator, and the like, and may be referred to as a data path circuit. The second memory chip 100b may be implemented substantially the same as the first memory chip 100a'. The third and fourth memory chips 200a and 200b may also be implemented substantially the same as the first memory chip 100a', and the ODT control circuits of the third and fourth memory chips 200a and 200b receive the second chip enable signal nCEx_2 instead of the first chip enable signal nCEx_1.

The ODT detector 110 may receive the ODT signal ODTx and output an internal ODT signal ODTi from the received ODT signal ODTx. For example, the ODT detector 110 may include an input buffer, and the input buffer may buffer the ODT signal ODTx to thereby output the internal ODT signal ODTi. The input circuit 140 may include an input buffer 141 and a read ODT circuit 142. The input buffer 141 may receive a read enable signal nREx and output an internal read enable signal nREi by buffering the received read enable signal nREx. The read ODT circuit 142 may be implemented similarly to the ODT circuit 101 of FIG. 1.

The I/O circuit 130 may include an input/output (I/O) buffer 131 and write ODT circuits 132. The I/O circuit 130 may transmit/receive data signals DQ0 through DQn and a data strobe signal DQS to/from the controller 20, where 'n' is a positive integer (e.g., 7). The I/O buffer 131 may output data to the memory core MC or receive data from the memory core MC. For example, the write ODT circuits 132 may be implemented similarly to the ODT circuit 101 of FIG. 1.

The ODT control circuit 120 may determine an ODT mode as either a write (program) ODT mode or a read ODT mode based on the internal ODT signal ODTi and the internal read enable signal nREi, and may accordingly generate a first ODT control signal ODT_EN1 controlling the write ODT circuits 132 and a second ODT control signal ODT_EN2 controlling the read ODT circuit 142, according to the determined ODT mode. In this regard, the ODT control circuit 120 may detect a logic level of the internal read enable signal nREi when the internal ODT signal ODTi is activated, and may generate the first and second ODT control signals ODT_EN1 and ODT_EN2, according to the detected logic level. In addition, the ODT control circuit 120 may determine ODT resistance based on the first chip enable signal nCEx_1 and the address ADD.

When the determined ODT mode is the write ODT mode, the write ODT circuits 132 may provide a first ODT resistor $R_{TT1}$ or a second ODT resistor $R_{TT2}$. For example, when the first chip enable signal nCEx_1 is disabled, the first ODT control signal ODT_EN1 may indicate the first ODT resistor $R_{TT1}$, and thus, the write ODT circuits 132 may provide the first ODT resistor $R_{TT1}$. When the first chip enable signal nCEx_1 is enabled and the address ADD indicates the second memory chip 100*b*, the first ODT control signal ODT_EN1 may indicate the second ODT resistor $R_{TT2}$, and thus, the write ODT circuits 132 may provide the second ODT resistor $R_{TT2}$. When the first chip enable signal nCEx_1 is enabled and the address ADD indicates the first memory chip 100*a*, the first ODT control signal ODT_EN1 may be deactivated, and thus, the write ODT circuits 132 may be disabled.

Further, when the determined ODT mode is the read ODT mode, the read ODT circuit 142 may provide the first ODT resistor $R_{TT1}$ or the second ODT resistor $R_{TT2}$. For example, when the first chip enable signal nCEx_1 is disabled, the second ODT control signal ODT_EN2 may indicate the first ODT resistor $R_{TT1}$, and thus, the read ODT circuit 142 may provide the first ODT resistor $R_{TT1}$. When the first chip enable signal nCEx_1 is enabled and the address ADD indicates the second memory chip 100*b*, the second ODT control signal ODT_EN2 may indicate the second ODT resistor $R_{TT2}$, and thus, the read ODT circuit 142 may provide the second ODT resistor $R_{TT2}$. And when the first chip enable signal nCEx_1 is enabled and the address ADD indicates the first memory chip 100*a*, the second ODT control signal ODT_EN2 may be deactivated, and thus, the read ODT circuit 142 may be disabled.

Figure 8:
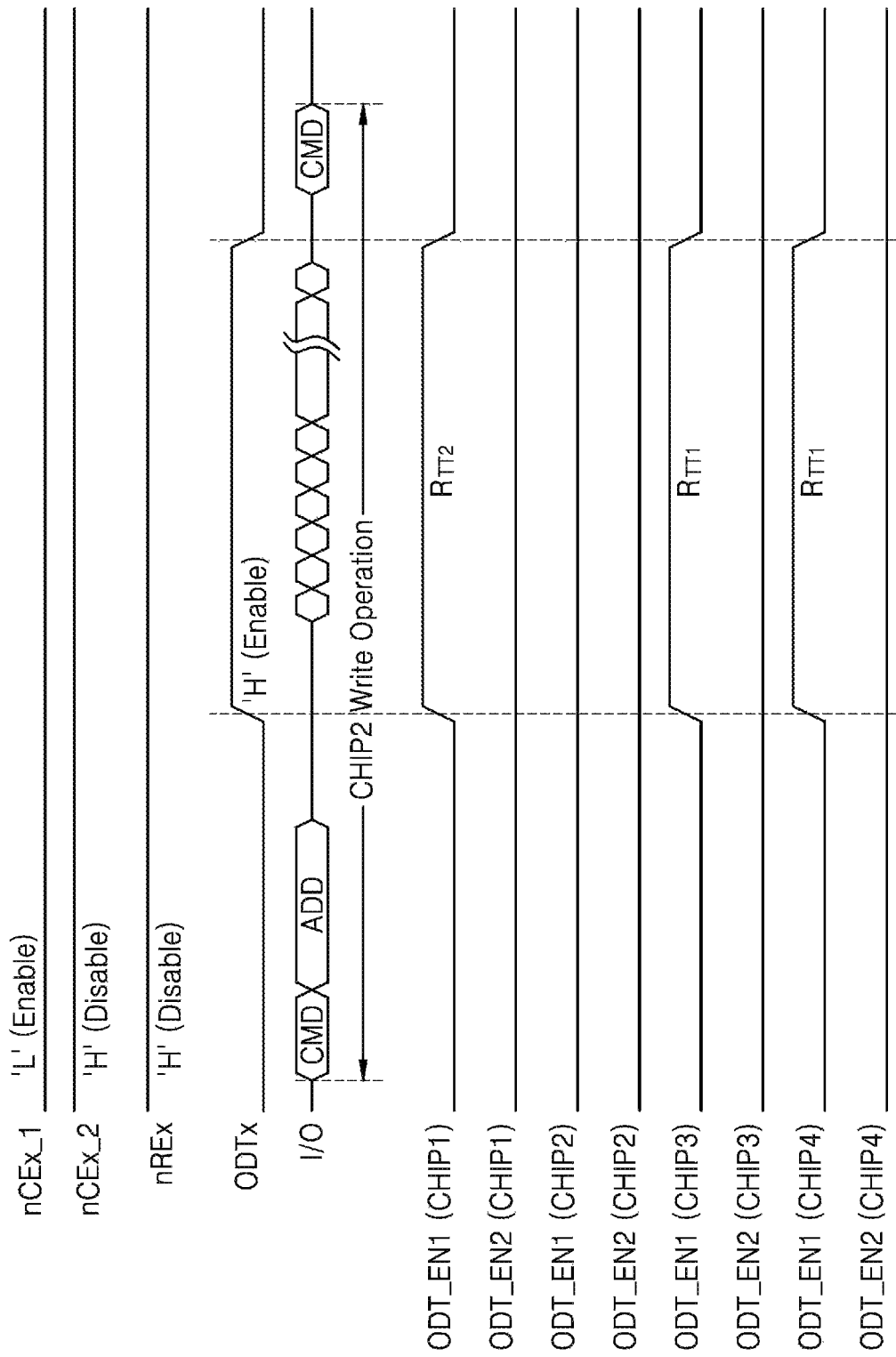
FIG. 8 is a timing diagram of a write operation according to an embodiment of the inventive concept.

FIG. 8 is a timing diagram further illustrating a write operation that may be performed by a storage device and operating method according to an embodiment of the inventive concept.

Referring to FIGS. 3, 6 and 8, when the first chip enable signal nCEx_1 is enabled (e.g., low) and the second chip enable signal nCEx_2 is disabled (e.g., high), a command CMD and an address ADD are communicated via an input/output (I/O) line. The ODT signal ODTx transitions to enabled (e.g., high) before a period in which data is input to the memory 10*a* at a high speed via the I/O line. For example, the second memory chip 100*b* may be selected and the first, third, and fourth memory chips 100*a*, 200*a*, and 200*b* may be non-selected.

The third and fourth memory chips 200*a* and 200*b* to which the disabled second chip enable signal nCEx_2 is applied may perform a termination operation during an ODT period during which the ODT signal ODTx is enabled, and in this case, ODT resistance may be the resistance of the second ODT resistor $R_{TT2}$. The second memory chip 100*b* to which the enabled first chip enable signal nCEx_1 is applied may not perform a termination operation.

The logic level of the read enable signal nREx may be detected at an activation point of the ODT signal ODTx. For example, the activation point of the ODT signal ODTx may correspond to a rising edge of the ODT signal ODTx. Here, when the read enable signal nREx is detected as disabled (e.g., high), the ODT mode is determined to be the write ODT mode, and each of the non-selected first, third, and fourth memory chips 100*a*, 200*a*, and 200*b* may activate the first ODT control signal ODT_EN1 according to the determined write ODT mode. Accordingly, the write ODT circuits 132 in the I/O circuit 130 may be enabled. Next, the first ODT control signal ODT_EN1 may be deactivated at a deactivation point of the ODT signal ODTx. Accordingly, the write ODT circuits 132 in the I/O circuit 130 may be disabled.

Figure 9:
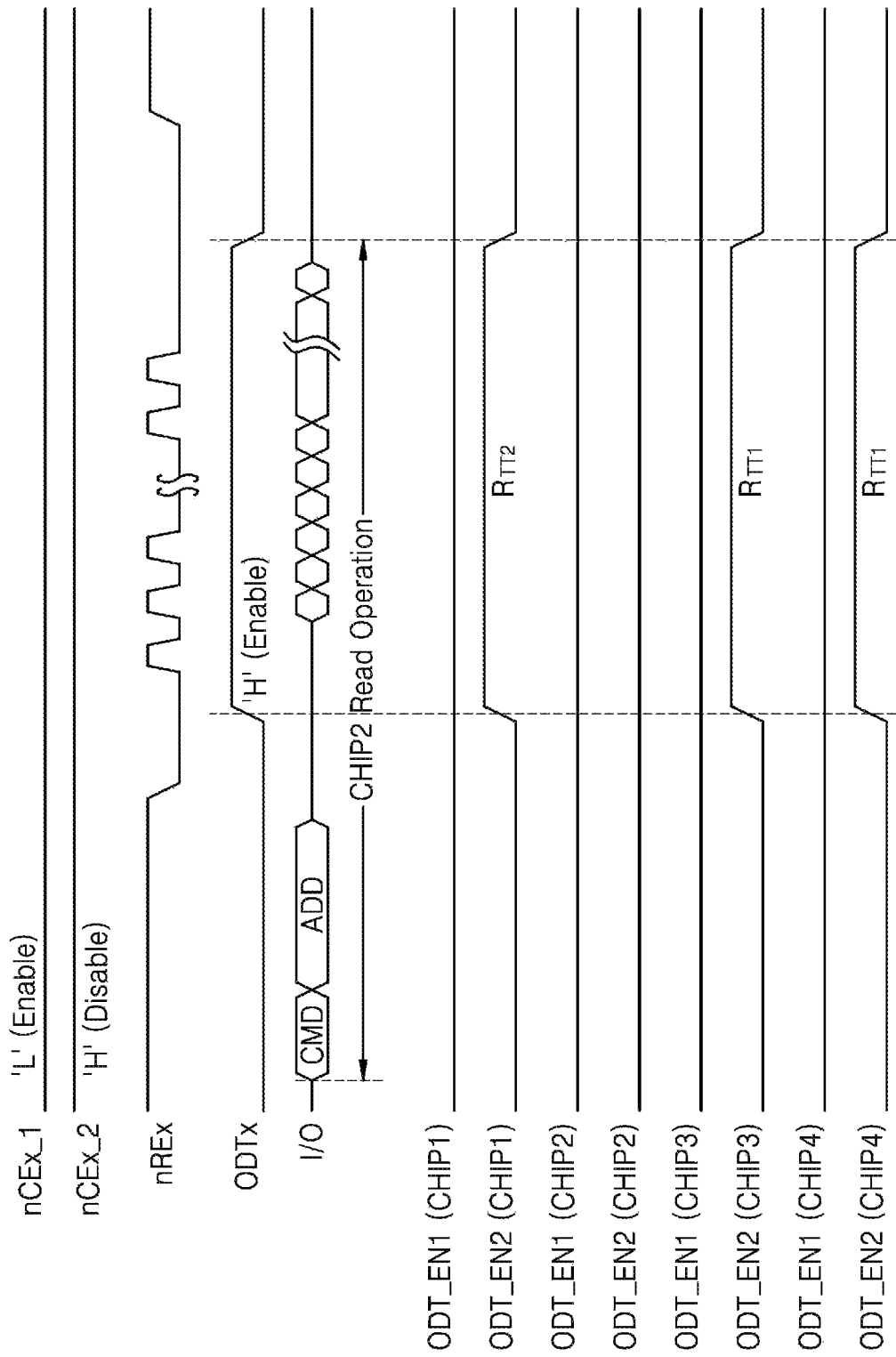
FIG. 9 is a timing diagram of a read operation according to an embodiment of the inventive concept.

FIG. 9 is another timing diagram further illustrating a read operation that may be performed by a storage device and operating method according to an embodiment of the inventive concept.

Referring to FIGS. 3, 6 and 9, when the first chip enable signal nCEx_1 is enabled (e.g., low) and the second chip enable signal nCEx_2 is disabled level (e.g., high), a command CMD and an address ADD are communicated via the I/O line. The ODT signal ODTx transitions to an enable level (e.g., high) before a period in which data is output at a high speed from the memory 10*b* through the I/O line. For example, the second memory chip 100*b* may be selected and the first, third, and fourth memory chips 100*a*, 200*a*, and 200*b* may be non-selected.

The third and fourth memory chips 200*a* and 200*b* to which the disabled second chip enable signal nCEx_2 is applied may perform a termination operation during an ODT period in which the ODT signal ODTx is enabled, and in this case, ODT resistance may be the resistance of the first ODT resistor $R_{TT1}$. The first memory chip 100*a* to which the enabled first chip enable signal nCEx_1 is applied may perform a termination operation during an ODT period in which the ODT signal ODTx is enabled, and in this case, ODT resistance may be the resistance of the second ODT resistor $R_{TT2}$. The second memory chip 100*b* to which the enabled first chip enable signal nCEx_1 is applied may not perform a termination operation.

The level of the read enable signal nREx may be detected at an activation point of the ODT signal ODTx. For example, the activation point of the ODT signal ODTx may correspond to a rising edge of the ODT signal ODTx. Here, when an enabled read enable signal nREx is detected (e.g., low), the ODT mode may be determined to be the read ODT mode, and each of the non-selected first, third, and fourth memory chips 100a, 200a, and 200b may activate the second ODT control signal ODT_EN2 according to the determined read ODT mode. Accordingly, the read ODT circuit 142 of the input circuit 140 may be enabled. Next, the second ODT control signal ODT_EN2 may be deactivated at a deactivation point of the ODT signal ODTx. Accordingly, the read ODT circuit 142 in the input circuit 140 may be disabled.

Figure 10:
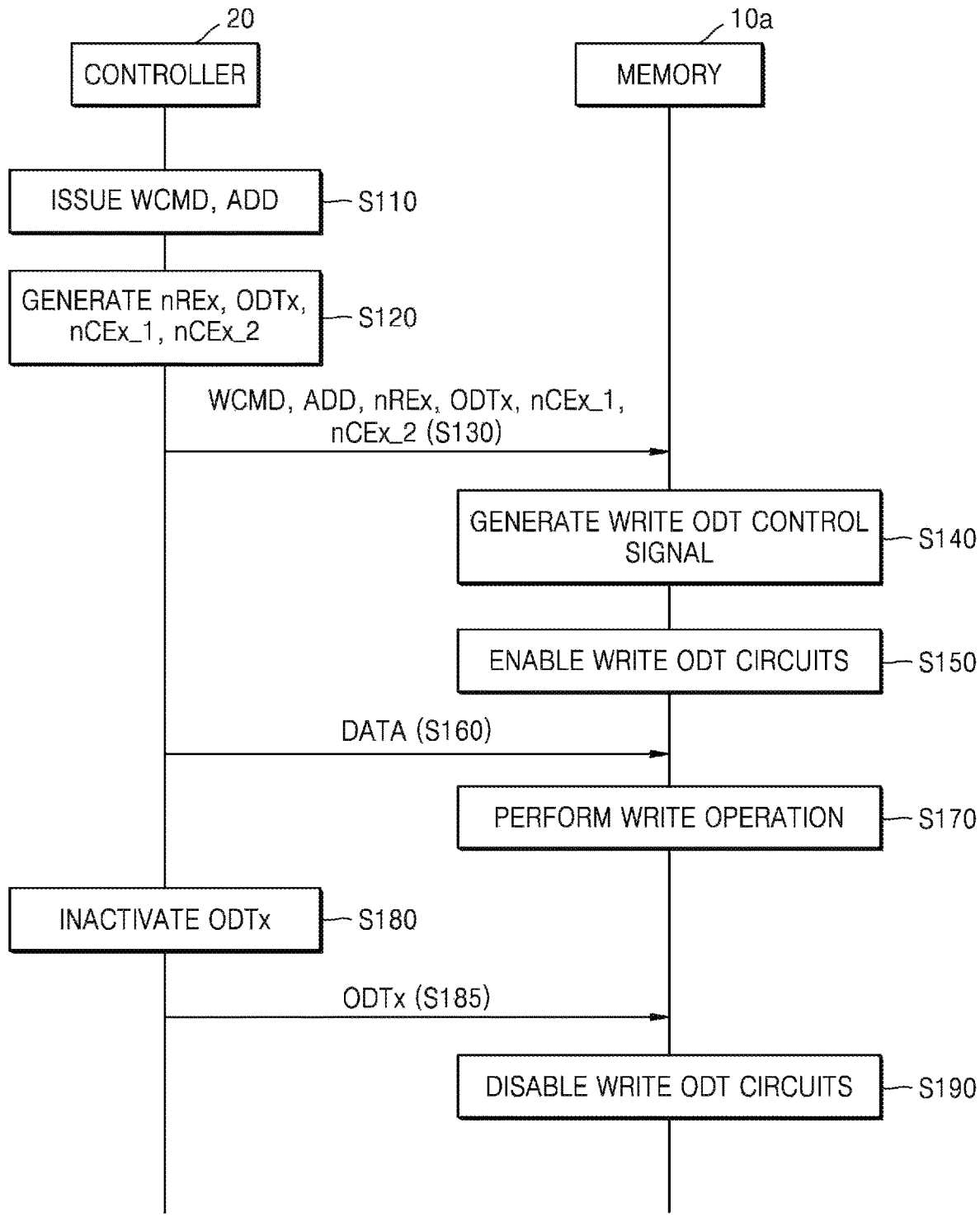
FIG. 10 is a flow diagram of a write operation between a controller and a memory, according to an embodiment of the inventive concept.

FIG. 10 is a flow diagram summarizing a control method for performing a write operation in a storage device like the one described in FIG. 3, including the controller 20 and memory 10a according to an embodiment of the inventive concept. This control method may be implemented using software resources running on the controller 20, for example as well hardware resources provided by the controller 20 and memory 10a.

Referring to FIGS. 3 and 10, the controller 20 issues a write command WCMD and an address ADD (S110). Then, the controller 20 generates a read enable signal nREx, an ODT signal ODTx, and first and second chip enable signals nCEx_1 and nCEx_2 (S120). In certain embodiments, these first two operations (S110 and S120) may be substantially sequential or simultaneous in their performance. The controller 20 may then communicate the write command WCMD, address ADD, read enable signal nREx, ODT signal ODTx, and first and second chip enable signals nCEx_1 and nCEx_2 to the memory 10a (S130).

The memory 10a determines an ODT mode to be a write ODT mode based on the read enable signal nREx and the ODT signal ODTx, and generates a write ODT control signal (S140). For example, the second memory chip 100b may be selected and the first, third and fourth memory chips 100a, 200a, and 200b may be non-selected. In this case, the first memory chip 100a may generate a write ODT control signal so that a write ODT circuit provides the second ODT resistor $R_{TT2}$, and each of the third and fourth memory chips 200a and 200b may generate a write ODT control signal so that a write ODT circuit provides the first ODT resistor $R_{TT1}$. The memory 10a enables write ODT circuits (S150).

The controller 20 then communicates data to be written to the memory 10a (S160), whereupon the first memory chip 100a of the memory 10a performs a write operation (S170). The controller 20 deactivates the ODT signal ODTx (S180), and communicates the deactivated ODT signal ODTx to the memory 10a (S185). The memory 10a then disables the write ODT circuits in response to the deactivated ODT signal ODTx (S190).

Figure 11:
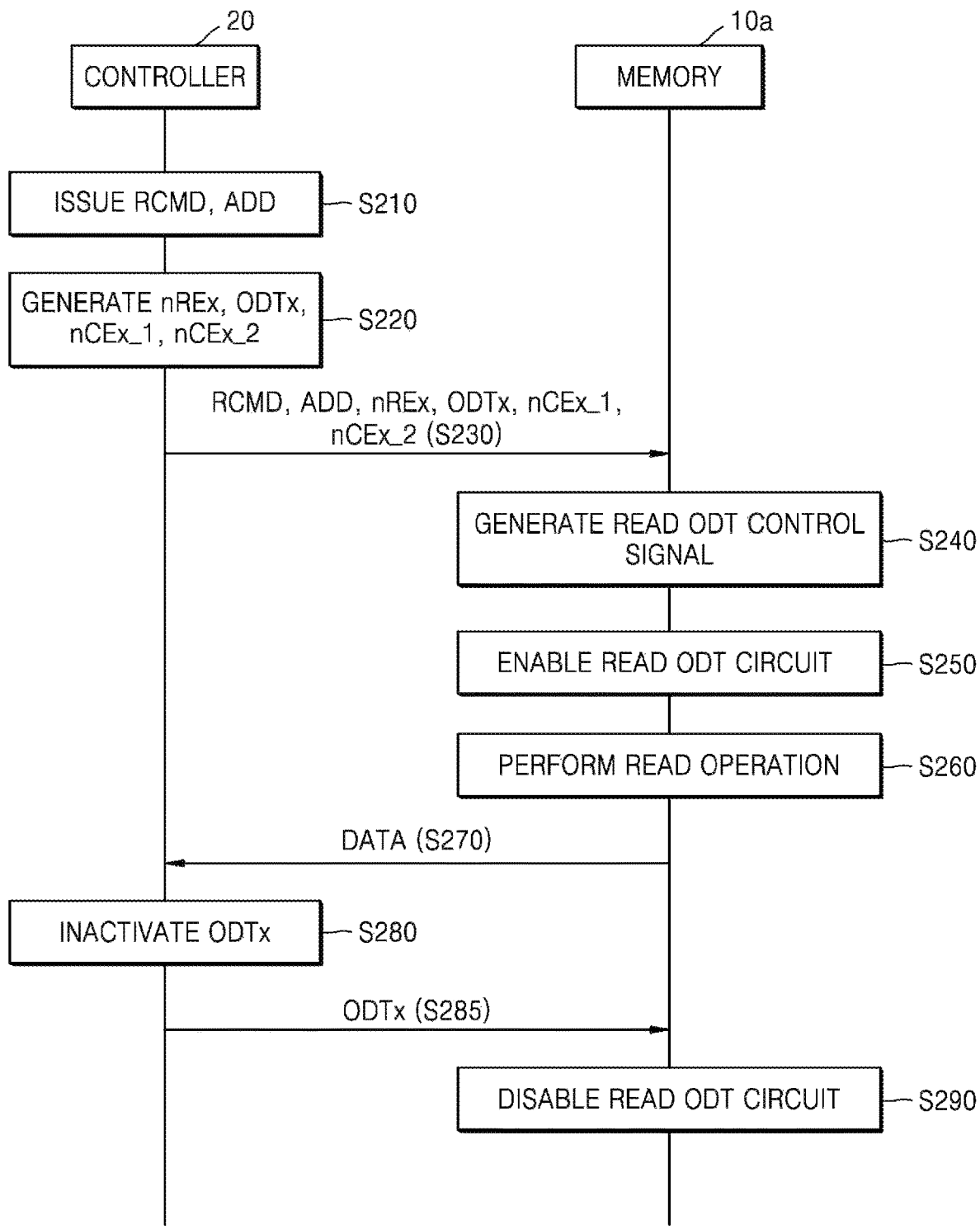
FIG. 11 is a flow diagram of a read operation between a controller and a memory, according to an embodiment of the inventive concept.

FIG. 11 is a flow diagram summarizing a control method for performing a read operation in a storage device like the one described in FIG. 3, including the controller 20 and memory 10a according to an embodiment of the inventive concept. This control method may be implemented using software resources running on the controller 20, for example as well hardware resources provided by the controller 20 and memory 10a.

Referring to FIGS. 3 and 11, the controller 20 issues a read command RCMD and an address ADD (S210). The controller 20 generates a read enable signal nREx, an ODT signal ODTx, and first and second chip enable signals nCEx_1 and nCEx_2 (S220). These first two operations S210 and S220 may be substantially sequential or simultaneous in their performance. The controller 20 communicates the read command RCMD, address ADD, read enable signal nREx, the ODT signal ODTx, and first and second chip enable signals nCEx_1 and nCEx_2 to the memory 10a (S230).

The memory 10a determines an ODT mode to be a read ODT mode based on the read enable signal nREx and the ODT signal ODTx, and generates a read ODT control signal (S240). For example, the second memory chip 100b may be selected and the first, third and fourth memory chips 100a, 200a, and 200b may be non-selected. In this case, the first memory chip 100a may generate a read ODT control signal so that a read ODT circuit provides the second ODT resistor $R_{TT2}$, and each of the third and fourth memory chips 200a and 200b may generate a read ODT control signal so that a read ODT circuit provides the first ODT resistor $R_{TT1}$. The memory 10a may then enable the read ODT circuit (S250).

The first memory chip 100a of the memory 10a performs a read operation (S260), and communicates corresponding read data to the controller 20 (S270). The controller 20 deactivates the ODT signal ODTx (S280), and the controller 20 communicates the deactivated ODT signal ODTx to the memory 10a (S285). Then, the memory 10a disables the read ODT circuit in response to the deactivated ODT signal ODTx (S290).

Figure 12:
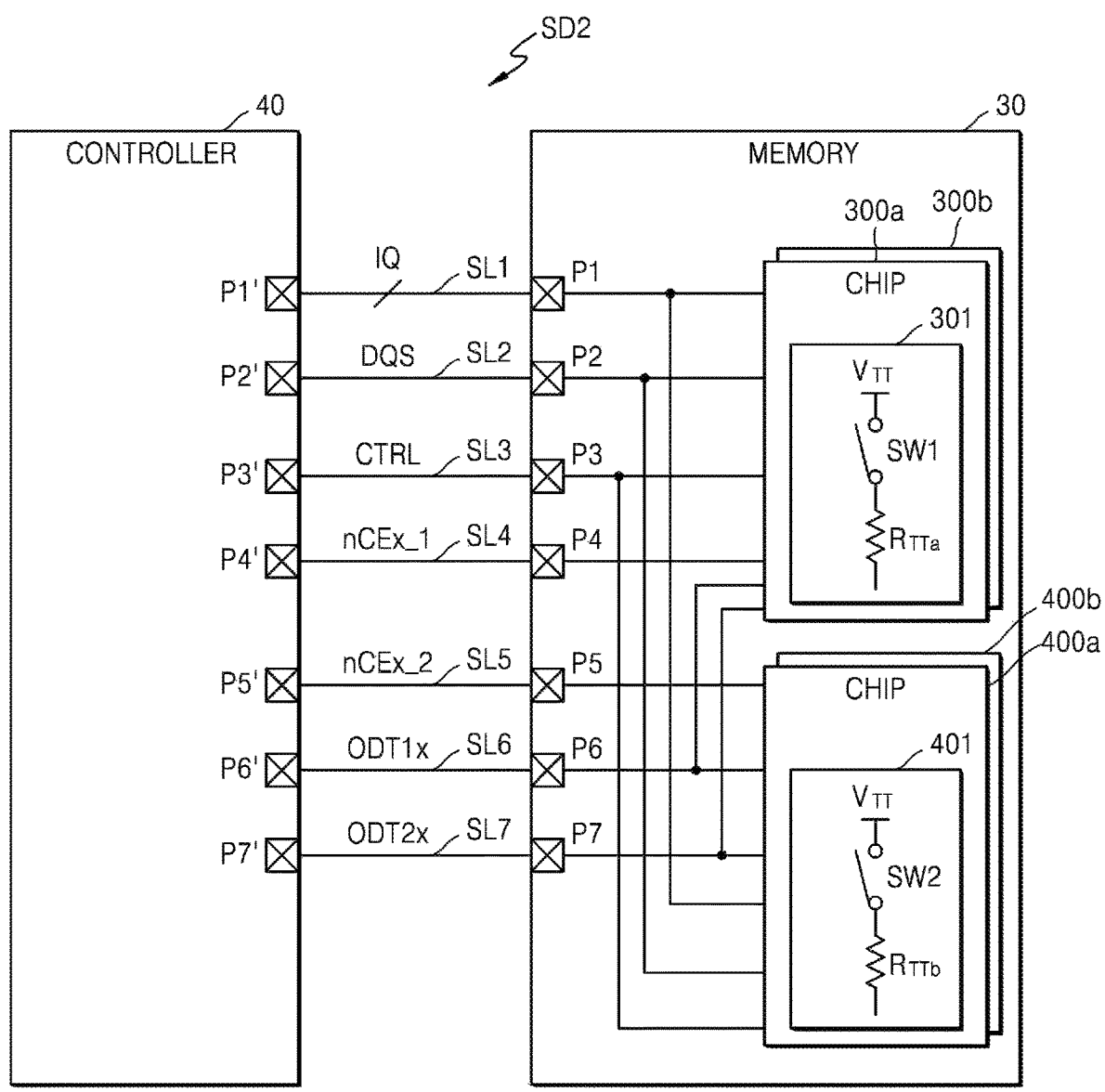
FIG. 12 is a block diagram schematically illustrating a storage device according to an embodiment of the inventive concept.

FIG. 12 is a block diagram illustrating a storage device SD2 according to an embodiment of the inventive concept.

Referring to FIG. 12, the storage device SD2 includes a memory 30 and a controller 40, wherein the memory 30 includes memory chips 300a, 300b, 400a, and 400b. The memory chip 300a may include an ODT circuit 301 and the memory chip 400a may include an ODT circuit 401. The storage device SD2 may be understood as a modified version of the storage device SD1 described in FIG. 1. Hereinafter, descriptions will be given by focusing on differences between the storage device SD1 of FIG. 1 and the storage device SD2 according to the present embodiment.

The memory 30 and the controller 40 may communicate with each other via first through seventh signal lines SL1 through SL7. Commands and addresses may be communicated via the first signal lines SL1, and next, data may be communicated via the first signal lines SL1. The data strobe signal DQS may be communicated via the second signal line SL2. The control signal CTRL may be communicated via the third signal line SL3. A first chip enable signal nCEx_1 may be communicated via the fourth signal line SL4. A second chip enable signal nCEx_2 may be communicated via the fifth signal line SL5. A first ODT signal ODT1x may be communicated via the sixth signal line SL6 and a second ODT signal ODT2x may be communicated via the seventh signal line SL7.

The memory 30 may include first through seventh pins P1 through P7, and the memory chips 300a, 300b, 400a, and 400b may be commonly connected to each of the first through third, sixth, and seventh pins P1 through P3, P6, and P7. The first pins P1 may be connected to the first signal lines SL1, respectively. The memory chips 300a and 300b may be connected to the fourth pin P4, and the memory chips 400a and 400b may be connected to the fifth pin P5. The controller 40 may include first through seventh pins P1' through P7' connected to the first through seventh signal lines SL1 through SL7, respectively.

According to the embodiment illustrated in FIG. 12, the memory 30 may receive the first and second ODT signals ODT1x and ODT2x from the controller 20 via the sixth and seventh pins P6 and P7, respectively. For example, the first ODT signal ODT1x may be a signal for controlling write ODT circuits and may define enable periods of the write ODT circuits. Alternately, the second ODT signal ODT2x may be a signal for controlling read ODT circuits and may define enable periods of the read ODT circuits. Accordingly, the memory chip 300a, which is non-selected, may enable an ODT circuit 301 based on the first and second ODT signals ODT1x and ODT2x, and each of the memory chips 400a and 400b, which are non-selected, may enable an ODT circuit 401 based on the first and second ODT signals ODT1x and ODT2x. Accordingly, signal reflection from the non-selected memory chips 300a, 400a, and 400b may be suppressed, and signal margins improved.

Figure 13:
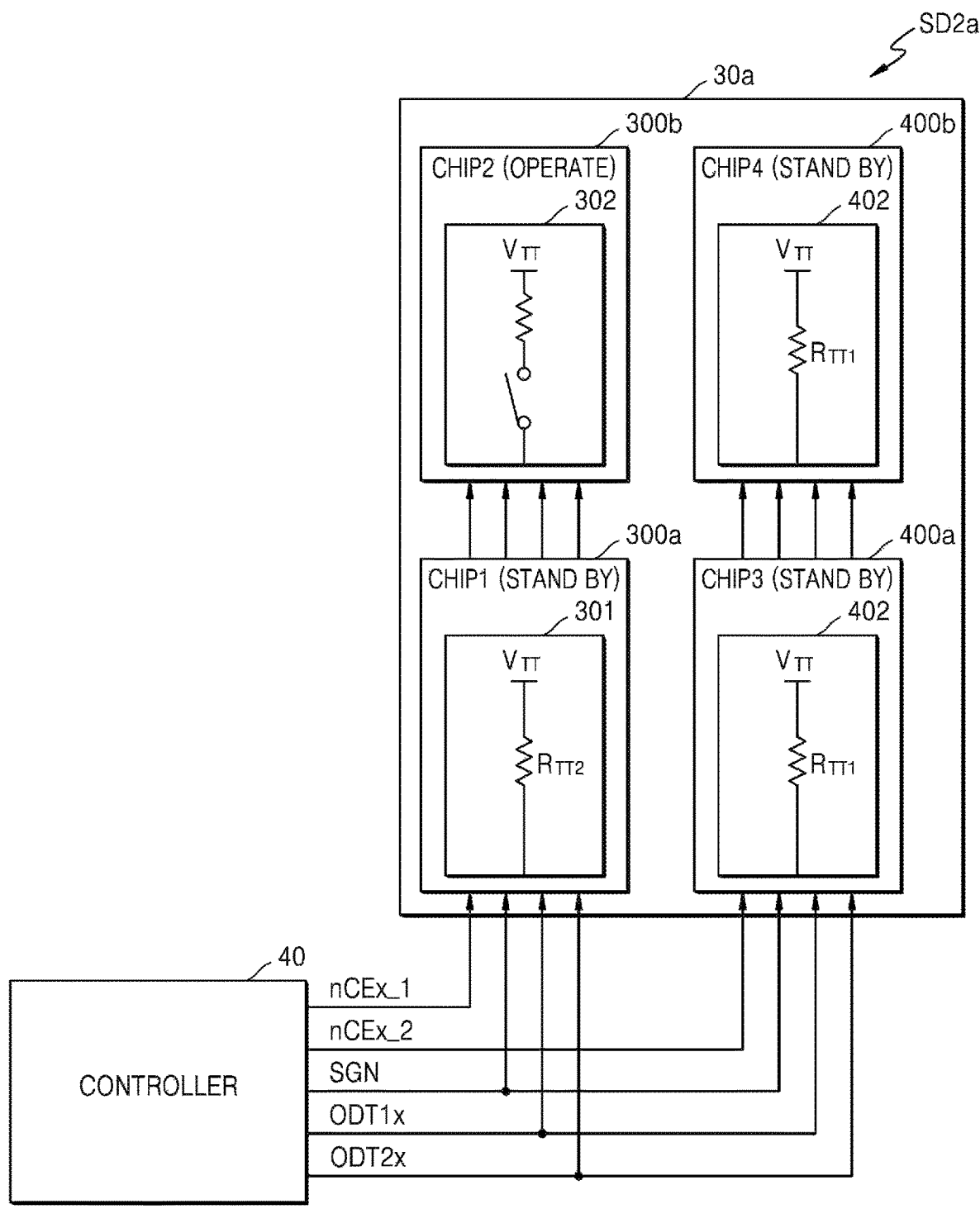
FIG. 13 is a block diagram of an example of the storage device of FIG. 12, according to an embodiment of the inventive concept.

FIG. 13 is a block diagram illustrating in another example (SD2a) the storage device SD2 of FIG. 12 according to an embodiment of the inventive concept.

Referring to FIG. 13, the storage device SD2a may include a memory 30a and a controller 40, and the memory 30a may include first through fourth memory chips 300a, 300b, 400a, and 400b. For example, the first chip enable signal nCEx_1 may be enabled (e.g., low), and the second chip enable signal nCEx_2 may be disabled (e.g., high). The controller 40 may provide the memory 30a with an address selecting the second memory chip 100b.

Accordingly, the second memory chip 300b may be selected, and the first, third, and fourth memory chips 300a, 400a, and 400b may be non-selected. Accordingly, a method of suppressing signal reflections from the non-selected first, third, and fourth memory chips 300a, 400a, and 400b is required. In one embodiment of the inventive concept, an ODT circuit 301 in the non-selected first memory chip 300a, an ODT circuit 401 in the non-selected third memory chip 400a, and an ODT circuit 402 in the non-selected fourth memory chip 400b are enabled, while an ODT circuit 302 in the selected second memory chip 300b is disabled.

The first and second memory chips 300a and 300b may receive the first chip enable signal nCEx_1, a signal SGN, and first and second ODT signals ODT1x and ODT2x from the controller 40. For example, the signal SGN may be one of a data signal, the data strobe signal DQS, or the control signal CTRL of FIG. 12. When the first ODT signal ODT1x is enabled, the first memory chip 300a may determine ODT resistance of a write ODT circuit based on the first chip enable signal nCEx_1. When the first chip enable signal nCEx_1 is enabled, the first memory chip 300a may determine the ODT resistance of the write ODT circuit to be the resistance of a second ODT resistor $R_{TT2}$. When the second ODT signal ODT2x is enabled, the first memory chip 300a may determine ODT resistance of a read ODT circuit based on the first chip enable signal nCEx_1. When the first chip enable signal nCEx_1 is enabled, the first memory chip 300a may determine the ODT resistance of the read ODT circuit to be the resistance of the second ODT resistor $R_{TT2}$.

The third and fourth memory chips 400a and 400b may receive the second chip enable signal nCEx_2, the signal SGN and the first and second ODT signals ODT1x and ODT2x from the controller 40. For example, the signal SGN may be a data signal, the data strobe signal DQS, or the control signal CTRL of FIG. 12. When the first ODT signal ODT1x is enabled, the third and fourth memory chips 400a and 400b may determine ODT resistance of a write ODT circuit based on the second chip enable signal nCEx_2. For example, when the second chip enable signal nCEx_2 is disabled, each of the third and fourth memory chips 400a and 400b may determine the ODT resistance of the write ODT circuit to be the resistance of a first ODT resistor $R_{TT1}$. When the second ODT signal ODT2x is enabled, the third and fourth memory chips 400a and 400b may determine ODT resistance of a read ODT circuit based on the second chip enable signal nCEx_2. When the second chip enable signal nCEx_2 is disabled, each of the third and fourth memory chips 400a and 400b may determine the ODT resistance of the read ODT circuit to be the resistance of the first ODT resistor $R_{TT1}$. The first ODT resistor $R_{TT1}$ and the second ODT resistor $R_{TT2}$ may have a different or the same resistance value. In certain embodiments of the inventive concept, the first ODT resistor $R_{TT1}$ or the second ODT resistor $R_{TT2}$ may have an infinite resistance value.

Figure 14:
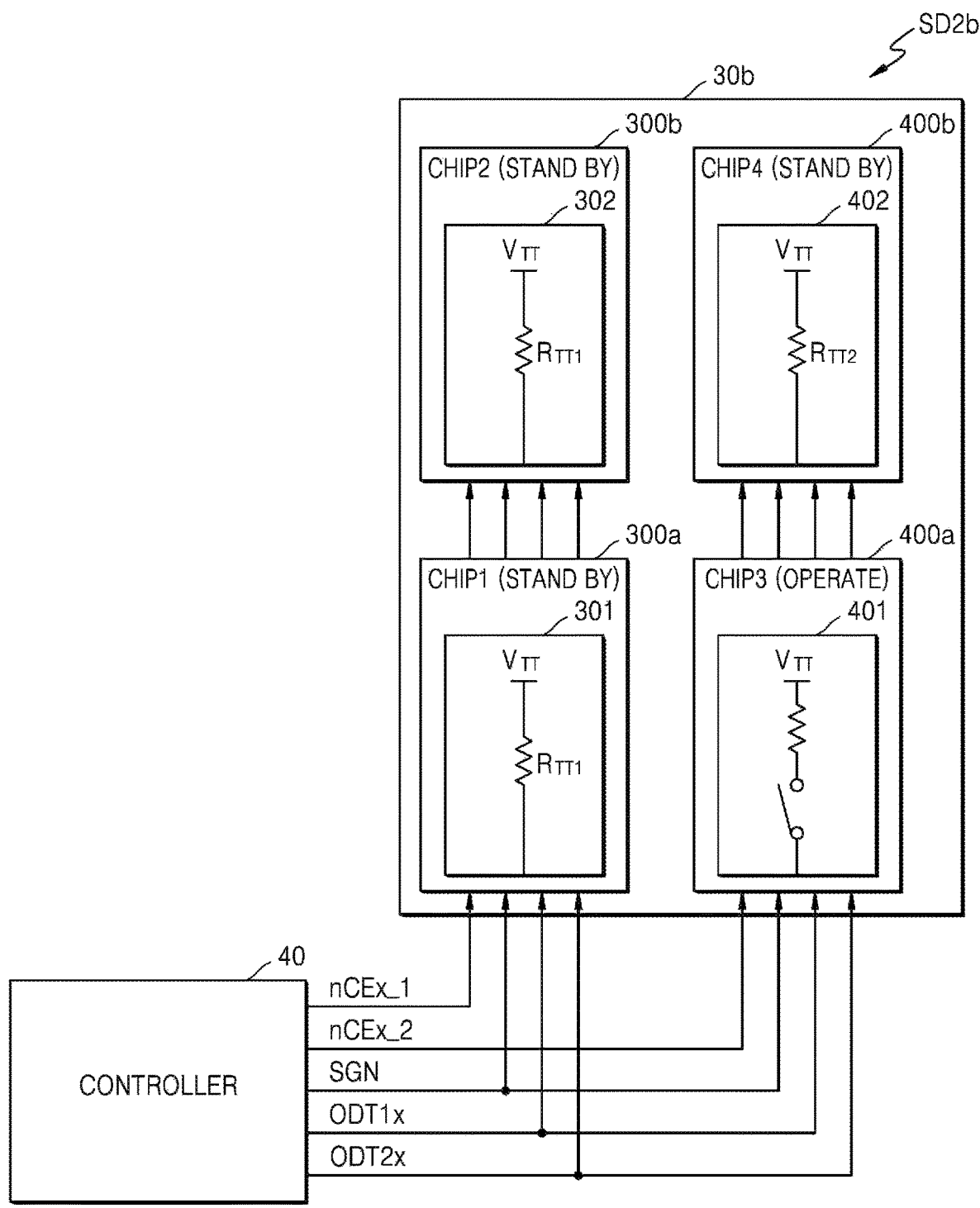
FIG. 14 is a block diagram of another example of the storage device of FIG. 12, according to an embodiment of the inventive concept.

FIG. 14 is a block diagram illustrating in still another example (SD2a) the storage device SD2 of FIG. 12 according to an embodiment of the inventive concept.

Referring to FIG. 14, the storage device SD2b may include a controller 40 and a memory 30b including first through fourth memory chips 300a, 300b, 400a, and 400b. For example, a first chip enable signal nCEx_1 may be disabled (e.g., high), and a second chip enable signal nCEx_2 may be enabled (e.g., low). The controller 40 may provide the memory 30b with an address for selecting the third memory chip 400a.

Accordingly, the third memory chip 400a may be selected, and the first, second, and fourth memory chips 300a, 300b, and 400b may be non-selected, such that a method of suppressing signal reflections from the non-selected first, second, and fourth memory chips 300a, 300b, and 400b is required. In an embodiment, an ODT circuit 301 in the non-selected first memory chip 300a, an ODT circuit 302 in the non-selected second memory chip 300b, and an ODT circuit 402 in the non-selected fourth memory chip 400b is enabled, while an ODT circuit 401 in the selected third memory chip 400a is disabled.

The first and second memory chips 300a and 300b receive the first chip enable signal nCEx_1, a signal SGN, and first and second ODT signals ODT1x and ODT2x from the controller 40. Here again, the signal SGN may be a data signal, the data strobe signal DQS, or the control signal CTRL of FIG. 12. When the first ODT signal ODT1x is enabled, the first and second memory chips 300a and 300b may determine ODT resistance of a write ODT circuit based on the first chip enable signal nCEx_1. When the first chip enable signal nCEx_1 is disabled, the first and second memory chips 300a and 300b may determine the ODT resistance of the write ODT circuit to be the resistance of a first ODT resistor $R_{TT1}$. In one embodiment assuming that the second ODT signal ODT2x is enabled, the first and second memory chips 300a and 300b may determine ODT resistance of a read ODT circuit based on the first chip enable signal nCEx_1. However, when the first chip enable signal nCEx_1 is disabled, the first and second memory chips 300a and 300b may determine the ODT resistance of the read ODT circuit to be the resistance of the first ODT resistor $R_{TT1}$.

The third and fourth memory chips 400a and 400b receive the second chip enable signal nCEx_2, signal SGN, and first and second ODT signals ODT1x and ODT2x from the controller 40. In one embodiment assuming that first ODT signal ODT1x is enabled, the fourth memory chip 400b may determine ODT resistance of a write ODT circuit based on the second chip enable signal nCEx_2. However, when the second chip enable signal nCEx_2 is enabled, the fourth memory chip 400b may determine the ODT resistance of the write ODT circuit to be the resistance of a second ODT resistor $R_{TT2}$. When the second ODT signal ODT2x is enabled, the fourth memory chip 400b may determine ODT resistance of a read ODT circuit based on the second chip enable signal nCEx_2. When the second chip enable signal nCEx_2 is enabled, the fourth memory chip 400b may determine the ODT resistance of the read ODT circuit to be the resistance of the second ODT resistor $R_{TT2}$. Here again, the first ODT resistor $R_{TT1}$ and second ODT resistor $R_{TT2}$ may have the same or a different resistance value and one or both of the first ODT resistor $R_{TT1}$ and second ODT resistor $R_{TT2}$ may have an infinite resistance value.

Figure 15:
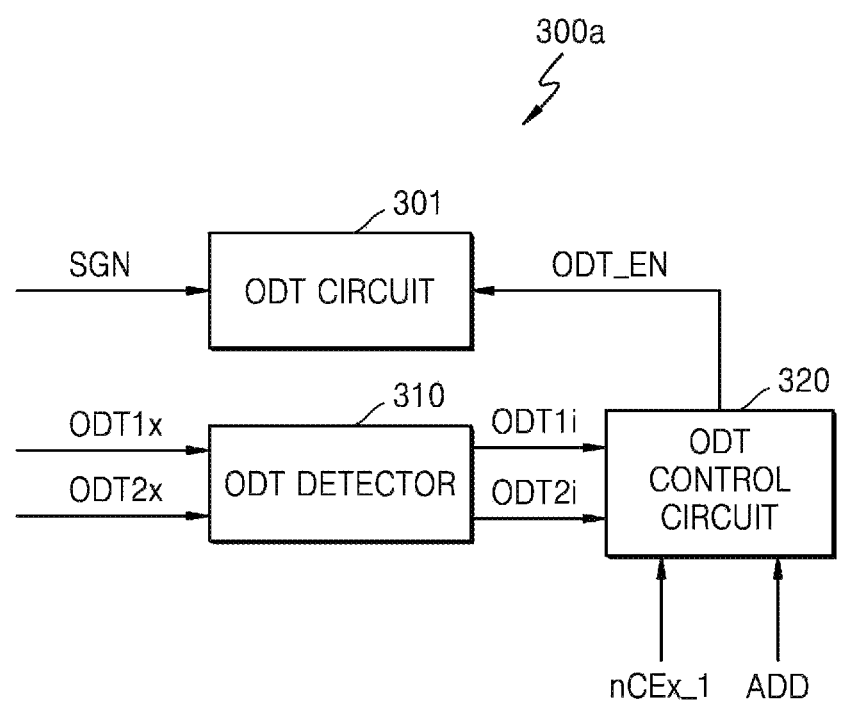
FIG. 15 is a block diagram of a first memory chip according to an embodiment of the inventive concept.

FIG. 15 is a block diagram further illustrating in one example (300a) the first memory chip of FIGS. 12, 13 and/or 14 according to an embodiment of the inventive concept.

Referring to FIGS. 3, 12, 13, 14 and 15, the first memory chip 300a includes an ODT detector 310, an ODT control circuit 320, and an ODT circuit 301. The ODT detector 310 receives first and second ODT signals ODT1x and ODT2x and generates first and second internal ODT signals ODT1i and ODT2i from the received first and second ODT signals ODT1x and ODT2x. The ODT control circuit 320 may generate an ODT control signal ODT_EN based on the first and second internal ODT signals ODT1i and ODT2i, a first chip enable signal nCEx_1, and an address ADD. The ODT circuit 301 receives a signal SGN and may provide a first ODT resistor (e.g., the first ODT resistor $R_{TT1}$ in FIG. 3) or a second ODT resistor (e.g., the second ODT resistor $R_{TT2}$ in FIG. 3) when the ODT control signal ODT_EN is activated. For example, the signal SGN may be a signal received from at least one of the first, second and third pins P1, P2 and P3 of FIG. 12.

Figure 16:
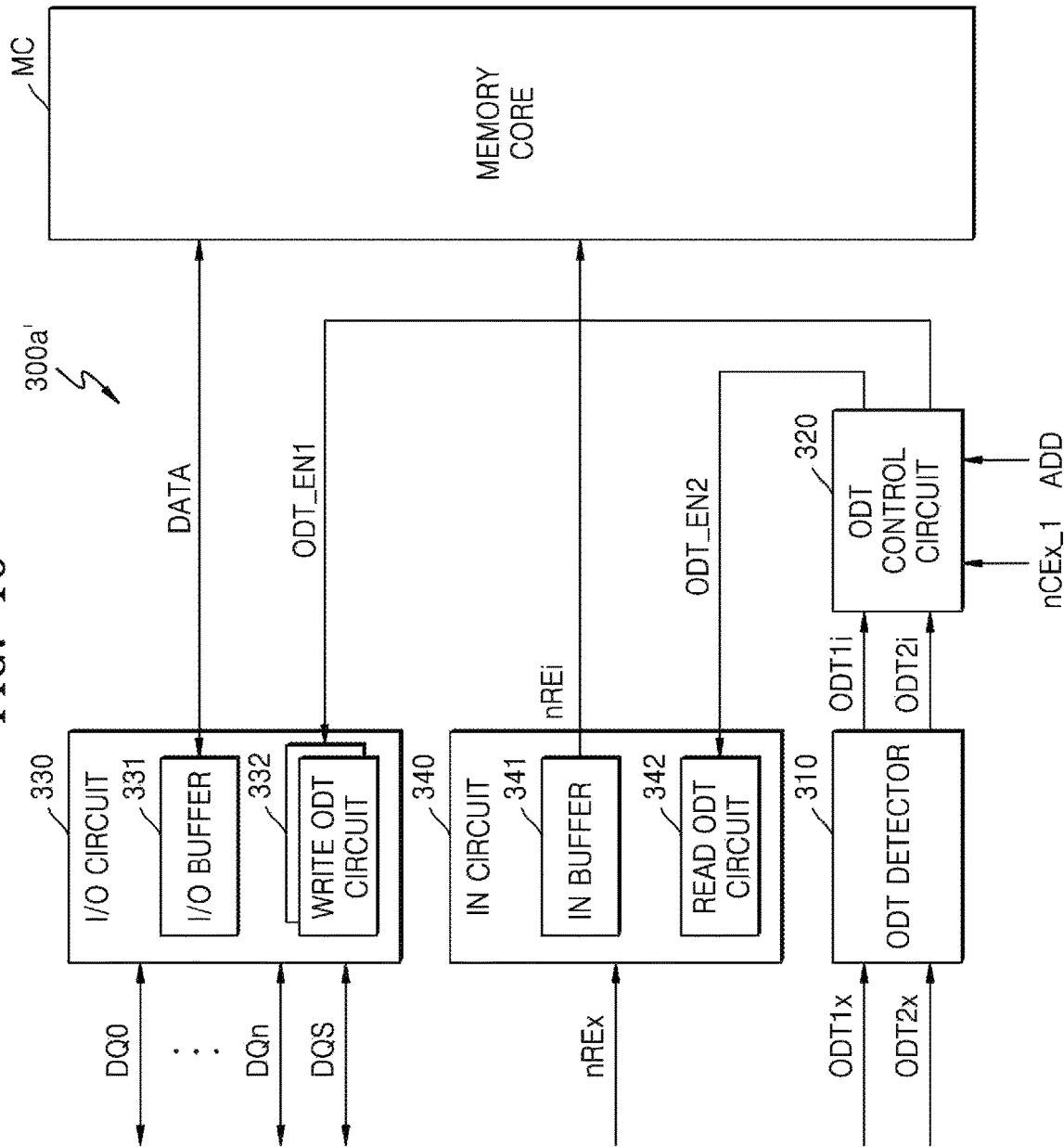
FIG. 16 is a block diagram illustrating a first memory chip according to an embodiment of the inventive concept in detail.

FIG. 16 is a block diagram further illustrating in anther example (300a') the first memory chip of FIGS. 12, 13 and 14 according to an embodiment of the inventive concept.

Referring to FIG. 16, the first memory chip 300a' includes an ODT detector 310, an ODT control circuit 320, an I/O circuit 330, and an input circuit 340. In addition, the first memory chip 300a' further includes a memory core MC, where the memory core MC includes a memory cell array, a row decoder, a page buffer, a voltage generator, and other conventionally understood components collectively referred to hereafter as constituting a data path circuit. Referring to FIGS. 12 and 16, the second memory chip 300b may be implemented substantially the same as the first memory chip 300a'. The third and fourth memory chips 400a and 400b may also be implemented substantially the same as the first memory chip 300a' with the ODT control circuits of the third and fourth memory chips 400a and 400b receiving the second chip enable signal nCEx_2 instead of the first chip enable signal nCEx_1.

Assuming this configuration, the ODT detector 310 receives the first and second ODT signals ODT1x and ODT2x and generates first and second internal ODT signals ODT1i and ODT2i from the received first and second ODT signals ODT1x and ODT2x. The ODT detector 310 may include an input buffer, which buffers the first and second ODT signals ODT1x and ODT2x to thereby output the first and second internal ODT signals ODT1i and ODT2i. The input circuit 340 may include an input buffer 341 and a read ODT circuit 342. The input buffer 341 may receive a read enable signal nREx and may output an internal read enable signal nREi by buffering the received read enable signal nREx. The read ODT circuit 342 may be implemented similarly to the ODT circuit 301 of FIG. 12.

The I/O output circuit 330 may include an I/O buffer 331 and write ODT circuits 332. The I/O circuit 330 may communicate (transmit and/or receive) a plurality of data signals DQ0 to DQn and a data strobe signal DQS to/from the controller 40 (see FIG. 12), where 'n' is a positive integer (e.g., 7). The I/O buffer 331 may output data to the memory core MC or receive data from the memory core MC. For example, the write ODT circuits 332 may be implemented similarly to the ODT circuit 301 of FIG. 12.

The ODT control circuit 320 may determine an ODT mode to be a write ODT mode or a read ODT mode based on the first and second internal ODT signals ODT1i and ODT2i, and may generate a first ODT control signal ODT_EN1 for controlling the write ODT circuits 332 and a second ODT control signal ODT_EN2 for controlling the read ODT circuit 342, according to the determined ODT mode. In an embodiment, the ODT control circuit 320 may generate the first ODT control signal ODT_EN1 when the first internal ODT signal ODT1i is activated and the second ODT control signal ODT_EN2 when the second internal ODT signal ODT2i is activated. In addition, the ODT control circuit 320 may determine ODT resistance based on the first chip enable signal nCEx_1 and the address ADD.

In one embodiment assuming that the determined ODT mode is the write ODT mode, the write ODT circuits 332 may provide a first ODT resistor $R_{TT1}$ or a second ODT resistor $R_{TT2}$. Thus, when the first chip enable signal nCEx_1 is disabled, the first ODT control signal ODT_EN1 may indicate the first ODT resistor $R_{TT1}$, and thus, the write ODT circuits 332 may provide the first ODT resistor $R_{TT1}$. When the first chip enable signal nCEx_1 is enabled and the address ADD indicates the second memory chip 300b, the first ODT control signal ODT_EN1 may indicate the second ODT resistor $R_{TT2}$, and thus, the write ODT circuits 332 may provide the second ODT resistor $R_{TT2}$. When the first chip enable signal nCEx_1 is enabled and the address ADD indicates the first memory chip 300a, the first ODT control signal ODT_EN1 may be deactivated, and thus, the write ODT circuits 332 may be disabled.

In an embodiment assuming that the determined ODT mode is the read ODT mode, the read ODT circuit 342 may provide the first ODT resistor $R_{TT1}$ or the second ODT resistor $R_{TT2}$. Thus, when the first chip enable signal nCEx_1 is disabled, the second ODT control signal ODT_EN2 may indicate the first ODT resistor $R_{TT1}$, and thus, the read ODT circuit 342 may provide the first ODT resistor $R_{TT1}$. When the first chip enable signal nCEx_1 is enabled and the address ADD indicates the second memory chip 300b, the second ODT control signal ODT_EN2 may indicate the second ODT resistor $R_{TT2}$, and thus, the read ODT circuit 342 may provide the second ODT resistor $R_{TT2}$. When the first chip enable signal nCEx_1 is enabled and the address ADD indicates the first memory chip 300a, the second ODT control signal ODT_EN2 may be deactivated, and thus, the read ODT circuit 342 may be disabled.

Figure 17:
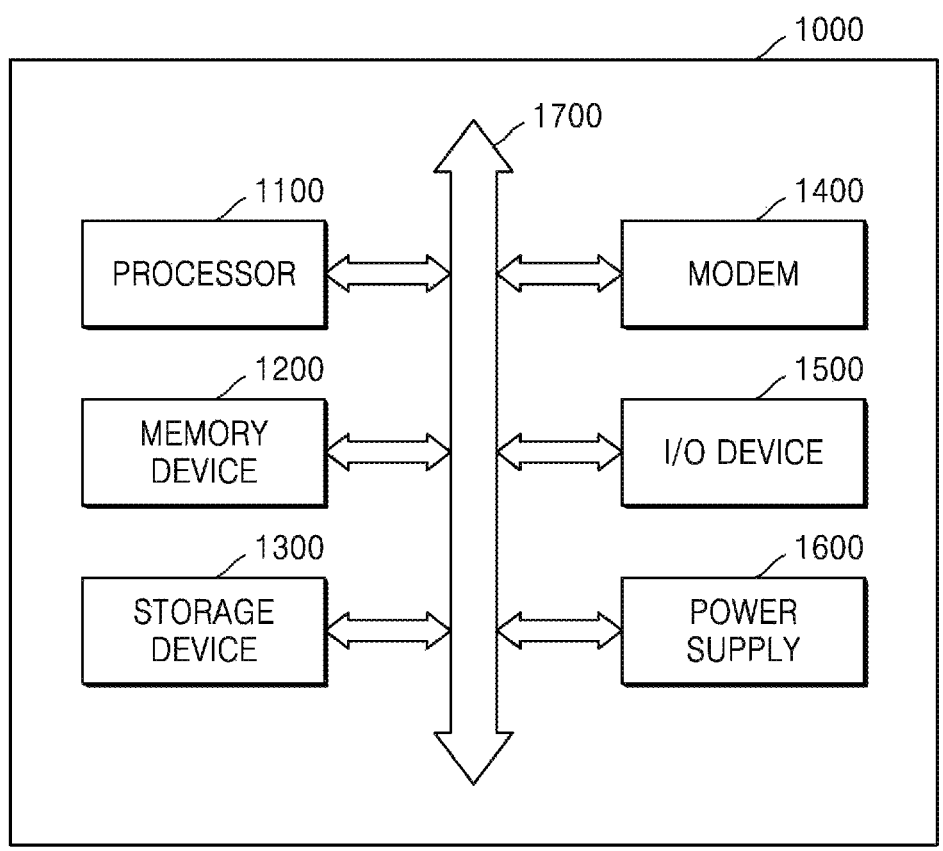
FIG. 17 is a block diagram of an electronic apparatus according to an embodiment of the inventive concept.

FIG. 17 is a block diagram of an electronic apparatus 1000 according to an embodiment of the inventive concept.

Referring to FIG. 17, the electronic apparatus 1000 may include a processor 1100, a memory device 1200, a storage device 1300, a modem 1400, an I/O device 1500, and a power supply 1600. According to the present embodiment, the storage device 1300 may be implemented according to the embodiments described in detail with reference to FIGS. 1 through 16. In detail, the storage device 1300 may include a memory and a controller, and the memory may include an ODT pin for receiving an ODT signal from the controller. Accordingly, when high speed communication is performed between the memory and the controller in the storage device 1300, the reflection of signals may be suppressed and a command overhead time may be reduced, and thus, the performance of the storage device 1300 and the overall performance of the electronic apparatus 1000 may be improved.

The memory may further include first and second chip enable signal pins for respectively receiving first and second chip enable signals from the controller. Accordingly, when high speed communication is performed between the memory and the controller in the storage device 1300, the reflection of signals may be more effectively suppressed by adjusting an ODT resistance value in a specific channel environment, and thus, the performance of the storage device 1300 and the overall performance of the electronic apparatus 1000 may be further improved.

While the inventive concept has been particularly shown and described with reference to embodiments thereof, it will be understood that various changes in form and details may be made therein without departing from the spirit and scope of the following claims.

What is claimed is:

1. An operating method of a storage device including a NAND flash memory device and a controller configured to control the NAND flash memory device, the method comprising:
   transmitting an on-die Termination (ODT) signal, via a single ODT signal line, from the controller to the NAND flash memory device including a first memory chip and a second memory chip, the first memory chip including a first ODT circuit, the second memory chip including a second ODT circuit, and the ODT signal defining an enable period for at least one of the first and second ODT circuits;
   transmitting a first chip enable signal, via a first chip enable signal line, from the controller to the first memory chip;
   transmitting a second chip enable signal, via a second chip enable signal line, from the controller to the second memory chip; and
   providing an ODT resistor by the at least one of the first and second ODT circuits, in response to the ODT signal and at least one of the first and second chip enable signals.

2. The operating method of claim 1, wherein the providing of the ODT resistor comprises at least one of:
   providing the ODT resistor by the first ODT circuit, in response to the ODT signal being enabled and the first chip enable signal being disabled; and
   providing the ODT resistor by the second ODT circuit, in response to the ODT signal being enabled and the second chip enable signal being disabled.

3. The operating method of claim 1, further comprising:
   communicating a signal, via a signal line, from the controller to the NAND flash memory device during an ODT period in which the ODT signal is enabled, thereby the at least one of the first and second ODT circuits being enabled to terminate the signal.

4. The operating method of claim 3, wherein the signal is at least one of a data signal, a data strobe signal, and a read enable signal.

5. The operating method of claim 3, wherein the signal is a read enable signal, and
   wherein the communicating of the signal comprises:
   communicating the read enable signal being toggled at a first toggle frequency, from the controller to the NAND flash memory device during the ODT period, thereby the first ODT circuit being enabled to terminate the read enable signal.

6. The operating method of claim 3, wherein the signal is a data strobe signal, and
   wherein the communicating of the signal comprises:
   transmitting the data strobe signal being toggled at a second toggle frequency, from the controller to the NAND flash memory device during the ODT period, thereby the first ODT circuit being enabled to terminate the data strobe signal.

7. The operating method of claim 1, further comprising:
   transmitting at least one set feature command including information associated with an ODT resistance value of at least one of the first and second memory chips, from the controller to the NAND flash memory device.

8. The operating method of claim 7, wherein the at least one set feature command includes at least one of:
   a set feature command including a first ODT resistance value associated with the first memory chip;
   a set feature command including a first ODT resistance value associated with the second memory chip;
   a set feature command including a second ODT resistance value associated with the first memory chip; and
   a set feature command including a second ODT resistance value associated with the second memory chip.

9. The operating method of claim 7, further comprising:
   after transmitting of the at least one set feature command, transmitting at least one program command or at least one read command, from the controller to the NAND flash memory device.

10. The operating method of claim 7, further comprising:
    storing the ODT resistance value by the at least one of the first and second memory chips,
    wherein the storing of the ODT resistance value is performed in advance of performing a program operation in response to the at least one program command or a read operation in response to the at least one read command.

11. An operating method of a storage device including a NAND flash memory device and a controller configured to control the NAND flash memory device, the method comprising:
    transmitting an on-die Termination (ODT) signal, via a single ODT signal line, from the controller to the NAND flash memory device including a first memory chip and a second memory chip, the first memory chip including a first ODT circuit, the second memory chip including a second ODT circuit, and the ODT signal defining an enable period for at least one of the first and second ODT circuits;
    transmitting a first chip enable signal, via a first chip enable signal line, from the controller to the first memory chip;
    transmitting a second chip enable signal, via a second chip enable signal line, from the controller to the second memory chip;
    transmitting a read enable signal, via a signal line, from the controller to the NAND flash memory device; and
    determining, by each of the first and second memory chips, an ODT mode as a write ODT mode or a read ODT mode in response to the read enable signal and the ODT signal.

12. The operating method of claim 11, wherein the determining of the ODT mode comprises:
    determining, by each of the first and second memory chips, the ODT mode as the write ODT mode, in response to the read enable signal being disabled at an activation point for the ODT signal; and
    determining, by each of the first and second memory chips, the ODT mode as the read ODT mode, in response to the read enable signal being enabled at the activation point for the ODT signal.

13. The operating method of claim 12, further comprising:
transmitting a data strobe signal from the controller to the first memory chip; and
upon determining of the ODT mode as the write ODT mode, providing a ODT resistor, by the first ODT circuit, in response to the ODT signal being enabled and the first chip enable signal being disabled, thereby the first ODT circuit being enabled to terminate the data strobe signal received by the first memory chip.

14. The operating method of claim 12, further comprising:
upon determining of the ODT mode as the read ODT mode, providing a ODT resistor, by the first ODT circuit, in response to the ODT signal being enabled and the first chip enable signal being disabled, thereby the first ODT circuit being enabled to terminate the read enable signal received by the first memory chip.

15. The operating method of claim 11, further comprising:
transmitting at least one set feature command including information associated with an ODT resistance value of at least one of the first and second memory chips, from the controller to the NAND flash memory device.

16. The operating method of claim 15, wherein the at least one set feature command includes at least one of:
a set feature command including a first ODT resistance value associated with the first memory chip;
a set feature command including a first ODT resistance value associated with the second memory chip;
a set feature command including a second ODT resistance value associated with the first memory chip; and
a set feature command including a second ODT resistance value associated with the second memory chip.

17. The operating method of claim 15, further comprising:
after transmitting of the at least one set feature command, transmitting at least one program command or at least one read command, from the controller to the NAND flash memory device.

18. The operating method of claim 17, further comprising:
storing the ODT resistance value by the at least one of the first and second memory chips,
wherein the storing of the ODT resistance value is performed in advance of performing a program operation in response to the at least one program command or a read operation in response to the at least one read command.

19. A controller comprising:
at least one input/output pin, through which at least one of a command, an address and data is communicated to a NAND flash memory device including a first memory chip and a second memory chip;
a single on-die Termination (ODT) pin, through which an ODT signal is transmitted to the NAND flash memory device;
a read enable signal pin, through which a read enable signal is transmitted to the NAND flash memory device;
a first chip enable signal pin, through which a first chip enable signal is transmitted to the first memory chip including a first ODT circuit; and
a second chip enable signal pin, through which a second chip enable signal is transmitted to the second memory chip including a second ODT circuit, and
wherein the controller is configured to:
transmit the ODT signal, via the ODT pin, to the NAND flash memory device, in order to enable at least one of the first and second ODT circuits, and
transmit at least one of the address, the read enable signal, and the first and second chip enable signals, in order to control an ODT resistor of the at least one of the first and second ODT circuits.

20. The controller of claim 19, wherein the controller is further configured to transmit at least one set feature command including information associated with an ODT resistance value of at least one of the first and second memory chips, to the NAND flash memory device, so that at least one of the first and second memory chips stores the ODT resistance value in advance of performing a program operation or a read operation.

* * * * *